United States Patent
Kim et al.

(10) Patent No.: US 8,581,373 B2
(45) Date of Patent: Nov. 12, 2013

(54) TAPE PACKAGE

(75) Inventors: Dong-han Kim, Osan-si (KR);
So-young Lim, Hwaseong-si (KR)

(73) Assignee: SAMSUNG Electronics Co., Ltd.,
Suwon-si (KR)

( * ) Notice: Subject to any disclaimer, the term of this patent is extended or adjusted under 35 U.S.C. 154(b) by 138 days.

(21) Appl. No.: 13/223,624

(22) Filed: Sep. 1, 2011

(65) Prior Publication Data

US 2012/0068349 A1    Mar. 22, 2012

(30) Foreign Application Priority Data

Sep. 20, 2010 (KR) ........................ 10-2010-0092507

(51) Int. Cl.
*H01L 23/495* (2006.01)
*H01L 23/053* (2006.01)

(52) U.S. Cl.
USPC ........... 257/668; 257/688; 257/692; 257/701; 257/773; 257/786; 257/E23.065

(58) Field of Classification Search
USPC ................. 257/668, 701, 692, 688, 773, 786, 257/E23.065
See application file for complete search history.

(56) References Cited

U.S. PATENT DOCUMENTS

| 4,862,322 | A | * | 8/1989 | Bickford et al. | 361/718 |
|---|---|---|---|---|---|
| 5,182,631 | A | * | 1/1993 | Tomimuro et al. | 257/664 |
| 5,414,299 | A | * | 5/1995 | Wang et al. | 257/702 |
| 5,517,036 | A | * | 5/1996 | Semba et al. | 257/418 |
| 5,625,298 | A | * | 4/1997 | Hirano et al. | 324/754.08 |
| 5,869,887 | A | * | 2/1999 | Urushima | 257/684 |
| 5,892,271 | A | * | 4/1999 | Takeda et al. | 257/668 |
| 5,920,115 | A | * | 7/1999 | Kimura et al. | 257/668 |
| 6,239,384 | B1 | * | 5/2001 | Smith et al. | 174/261 |
| 6,448,634 | B1 | * | 9/2002 | Hashimoto | 257/668 |
| 6,870,276 | B1 | * | 3/2005 | Moxham et al. | 257/784 |
| 8,174,110 | B2 | * | 5/2012 | Imai | 257/692 |

FOREIGN PATENT DOCUMENTS

| JP | 2005-093468 | 4/2005 |
|---|---|---|
| JP | 2005-175267 | 6/2005 |
| KR | 10-2008-0088796 | 10/2008 |

* cited by examiner

*Primary Examiner* — Nitin Parekh
(74) *Attorney, Agent, or Firm* — Stanzione & Kim, LLP

(57) ABSTRACT

A tape package providing a plurality of input and output portions each having a minimum pitch. The tape package includes a tape wiring substrate including first and second wirings, and a semiconductor chip mounted on the tape wiring substrate, and including a first edge, a first pad disposed adjacent to the first edge, and a second pad disposed to be farther spaced apart from the first edge than the first pad, where the first wiring is connected to a portion of the first pad that is spaced from the first edge by a first distance, and where the second wiring is connected to a portion of the second pad that is spaced from the first edge by a second distance that is greater than the first distance.

33 Claims, 25 Drawing Sheets

FIG. 34
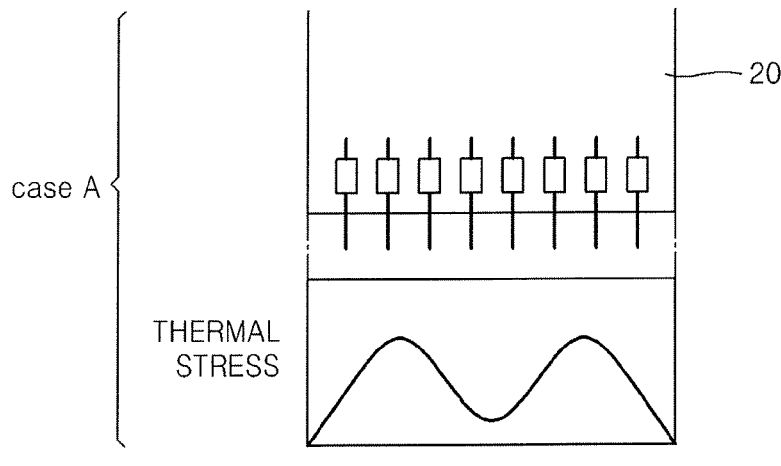
case A
THERMAL STRESS
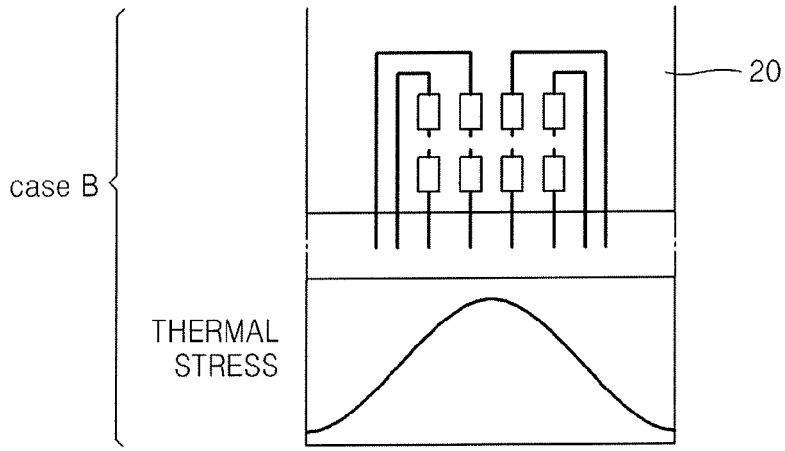
case B
THERMAL STRESS
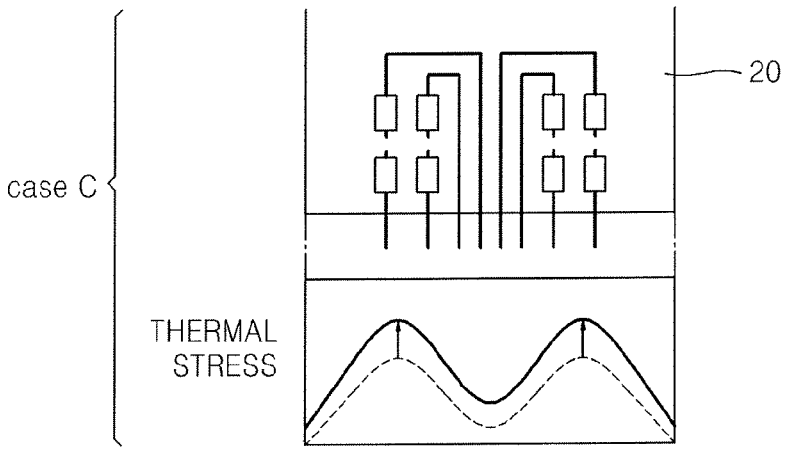
case C
THERMAL STRESS

TAPE PACKAGE

CROSS-REFERENCE TO RELATED APPLICATIONS

This application claims priority under 35 U.S.C §119(a) from Korean Patent Application No. 10-2010-0092507, filed on Sep. 20, 2010, in the Korean Intellectual Property Office, the disclosure of which is incorporated herein in its entirety by reference.

BACKGROUND OF THE INVENTION

1. Field of the Invention

The inventive concept relates to a tape package, and more particularly, to a tape package in which a semiconductor chip is mounted on a thin tape.

2. Description of the Related Art

Recently, as flat panel display devices such as a liquid crystal display (LCD) have been developed, an industry of tape packages used as components of driver chips of display devices is also developing. The tape package uses a tape automated bonding (TAB) method using an input/output wiring pattern that is mounted on a tape wiring substrate by being directly attached to a printed circuit board (PCB) or a display panel.

SUMMARY OF THE INVENTION

The inventive concept provides a tape package in which a semiconductor chip is mounted on a thin tape.

Additional features and utilities of the present general inventive concept will be set forth in part in the description which follows and, in part, will be obvious from the description, or may be learned by practice of the general inventive concept.

Exemplary embodiments of the present general inventive concept provide a tape package including a tape wiring substrate including first and second wirings, and a semiconductor chip mounted on the tape wiring substrate, and including a first edge, a first pad disposed adjacent to the first edge, and a second pad disposed to be farther spaced apart from the first edge than the first pad, where the first wiring is connected to a portion of the first pad that is spaced from the first edge by a first distance, where the second wiring is connected to a portion of the second pad from the first edge by a second distance that is greater than the first distance.

In exemplary embodiments of the present general inventive concept, the first wiring and the second wiring are respectively connected to the first pad and the second pad in opposite directions.

In exemplary embodiments of the present general inventive concept, the first wiring and the second wiring extend parallel to each other.

In exemplary embodiments of the present general inventive concept, the second wiring may include one or more bending portions.

In exemplary embodiments of the present general inventive concept, at least some of the bending portions are perpendicular types or curved types.

In exemplary embodiments of the present general inventive concept, the second wiring may include a first portion extending in a first direction, a second portion connected to the first portion and extending from the first portion in a second direction having a first angle to the first direction, and a third portion connected to the second portion, extending from the second portion in a third direction having a second angle to the second direction, and connected to a portion of the second pad that is spaced from the first edge by the second distance.

In exemplary embodiments of the present general inventive concept, the second portion is connected to end areas of the first portion and the third portion.

In exemplary embodiments of the present general inventive concept, the second portion is connected to the first portion and the third portion so as to cross them.

In exemplary embodiments of the present general inventive concept, the second wiring may include a first portion extending in a first direction, and a second portion connected to the first portion, extending from the first portion in a second direction having a first angle to the first direction, and connected to a portion of the second pad relatively far from the first edge.

In exemplary embodiments of the present general inventive concept, the second pad is arranged with respect to the first pad in a vertical direction with respect to the first edge.

Exemplary embodiments of the present general inventive concept can also provide a tape package including a tape wiring substrate including one or more first wirings and one or more second wirings, and a semiconductor chip mounted on the tape wiring substrate, and including a first edge, one or more first pads arranged in a first row to be disposed adjacent to and spaced from the first edge by a first distance, and one or more second pads arranged in a second row to be spaced apart from the first edge by a second distance that is greater than the first distance, where each of the first wirings is connected to a portion of each of the first pads spaced by the first distance from the first edge, where each of the second wirings is connected to a portion of each of the second pads spaced by the second distance from the first edge.

In exemplary embodiments of the present general inventive concept, a plurality of the second pads are adjacent to one another.

In exemplary embodiments of the present general inventive concept, a plurality of the second wirings are adjacent to one another.

In exemplary embodiments of the present general inventive concept, a plurality of the second wirings extend in the same direction to be connected to the second pads, respectively.

In exemplary embodiments of the present general inventive concept, a plurality of the second wirings extend in opposite directions to be connected to the second pads, respectively.

In exemplary embodiments of the present general inventive concept, each of the second pads is disposed adjacent to each of the second wirings connected thereto.

Exemplary embodiments of the present general inventive concept can also provide a tape package including a tape wiring substrate including one or more input wirings, one or more first output wirings, and one or more second output wirings; and a semiconductor chip mounted on the tape wiring substrate, and including a first edge, input pads respectively connected to the input wirings, one or more first output pads arranged in a first row to be disposed adjacent to the first edge, and one or more second output pads arranged in a second row to be farther spaced from the first edge than the first output pads, wherein each of the first output wirings is connected to a portion of each of the first output pads that are spaced at a first distance from the first edge, where each of the second output wirings is connected to a portion of each of the second output pads that are spaced at a second distance from the first edge that is greater than the first distance.

In exemplary embodiments of the present general inventive concept, the input pads may include one or more first input pads arranged in a third row to be disposed adjacent to the first edge and one or more second input pads arranged in a fourth row to be farther spaced from the first edge than the first input pads.

In exemplary embodiments of the present general inventive concept, the input wirings may include first input wirings and second input wirings, each of the first input wirings is connected to a portion of each of the first input pads that are spaced from the first edge, and each of the second input wirings is connected to a portion of each of the second input pads that are spaced further from the first edge than the first input pads.

In exemplary embodiments of the present general inventive concept, each of the first input wirings is connected to a portion of each of the first input pads that are space close to the first edge, and each of the second input wirings is connected to a portion of each of the second input pads that are spaced close to the first edge.

Exemplary embodiments of the present general inventive concept also provide a tape package including a tape wiring substrate including first and second wirings, a semiconductor chip mounted on the tape wiring substrate, the semiconductor chip having a first edge, a first pad disposed on the semiconductor chip so as to be centered on a first axis and spaced from the first edge by a first distance, the first pad coupled to the first wiring, and a second pad disposed on the semiconductor chip so as to be centered on the first axis and to be spaced from the first edge by a second distance that is greater than the first distance, the second pad coupled to the second wiring.

The tape package may include at least one input pad disposed adjacent to the first pad, where the tape wiring substrate includes input wiring that is coupled to the at least one input pad.

The tape package may include at least one input pad disposed adjacent to the second wirings.

The tape package may include a first input pad disposed on the semiconductor chip so as to be centered on a third axis and spaced from the first edge by a third distance, the first input pad coupled to a first input wiring included in the tape wiring substrate, and a second input pad disposed on the semiconductor chip so as to be centered on the third axis and to be spaced from the first edge by a fourth distance that is greater than the third distance, the second input pad coupled to a second input wiring included in the tape wiring substrate.

The tape package may include where the second input wiring is disposed adjacent to the first input pad and the second input pad.

The tape package may include where the second input wiring is adjacent to at least one of the first pad and the second pad.

The tape package may include where the second input pad is spaced from the first edge by the fourth distance so as to be adjacent to a second edge of the semiconductor chip.

The tape package may include where the second input pad is spaced from the first edge by the fourth distance so as to be adjacent to a second edge of the semiconductor chip.

The tape package may include where the second input pad is spaced from the first edge by the fourth distance so as to be adjacent to a second edge of the semiconductor chip.

Exemplary embodiments of the present general inventive concept may also provide a tape package including a tape wiring substrate including first and second wirings, a semiconductor chip mounted on the tape wiring substrate, the semiconductor chip having a first edge, a plurality of first pads disposed on the semiconductor chip so as to be respectively centered on a plurality of axes that are parallel to one another, the plurality of first pads being spaced from the first edge by a first distance, and each of the plurality of first pads coupled to the first wirings, and a plurality of second pads disposed on the semiconductor chip so as to be respectively centered on the plurality of axes and to be spaced from the first edge by a second distance that is greater than the first distance, and each of the plurality of second pads coupled to the second wirings.

The tape package may include at least one input pad disposed adjacent to at least one of the plurality of first pads, where the tape wiring substrate includes input wiring that is coupled to the at least one input pad.

The tape package may include at least one input pad disposed adjacent to the second wirings.

The tape package may include a first input pad disposed on the semiconductor chip so as to be centered on a third axis and spaced from the first edge by a third distance, the first input pad coupled to a first input wiring included in the tape wiring substrate, and a second input pad disposed on the semiconductor chip so as to be centered on the third axis and to be spaced from the first edge by a fourth distance that is greater than the third distance, the second input pad coupled to a second input wiring included in the tape wiring substrate.

The tape package may include where the second input wiring is disposed adjacent to the first input pad and the second input pad.

The tape package may include where the second input wiring is adjacent to at least one of the plurality of first pads and at least one of the plurality of second pads.

The tape package may include where the second input pad is spaced from the first edge by the fourth distance so as to be adjacent to a second edge of the semiconductor chip.

BRIEF DESCRIPTION OF THE DRAWINGS

Exemplary embodiments of the present general inventive concept will be more clearly understood from the following detailed description taken in conjunction with the accompanying drawings in which:

FIG. 34 illustrates graphs for explaining a thermal stress effect according to arrangement of pads of a semiconductor chip included in a tape package, according to exemplary embodiments of the present general inventive concept;

DETAILED DESCRIPTION OF THE PREFERRED EMBODIMENTS

Figure 1:
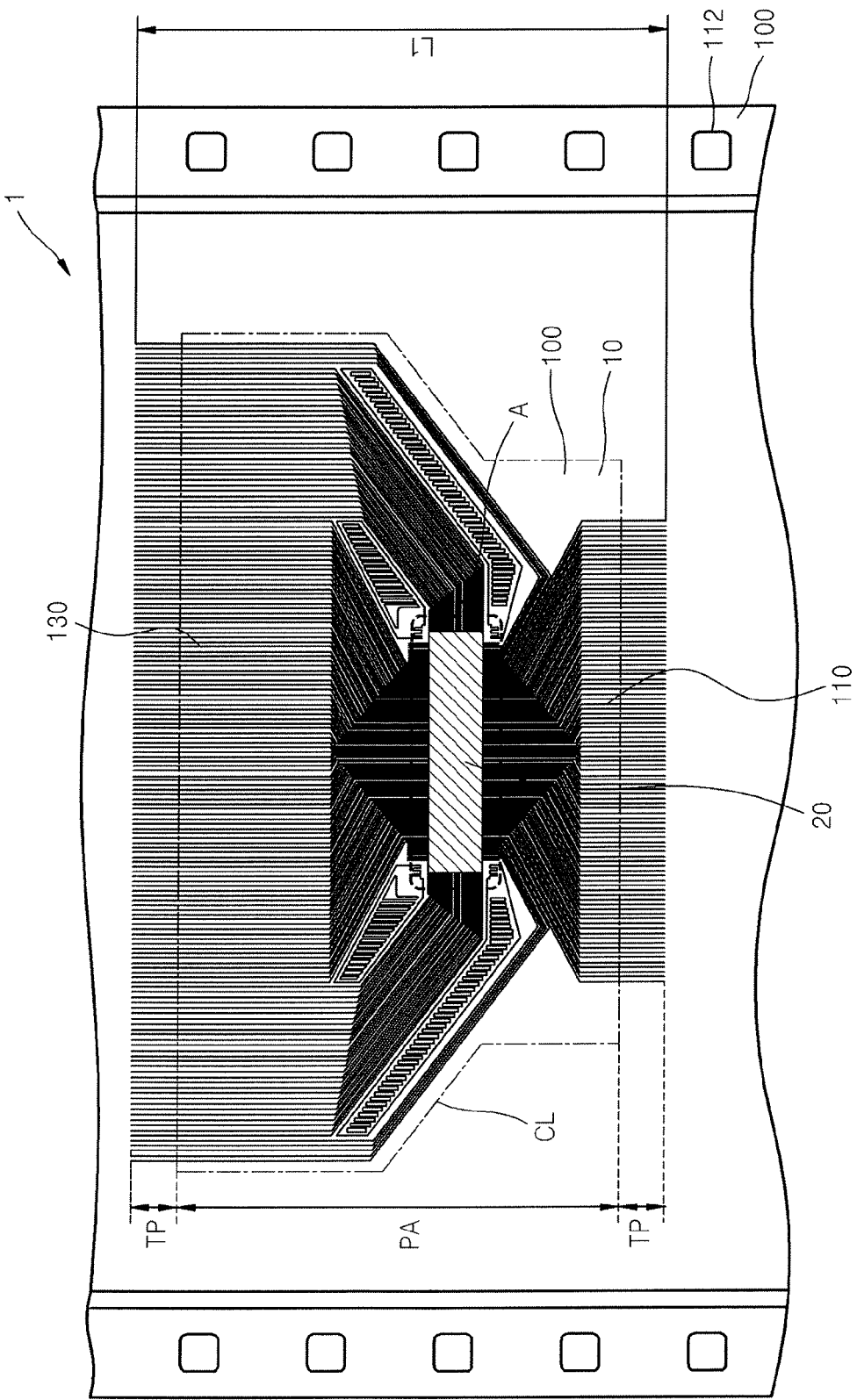
FIG. 1 is a plane view illustrating a tape package, according to exemplary embodiments of the present general inventive concept.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a plane view illustrating a tape package 1, according to exemplary embodiments of the present general inventive concept.

Referring to FIG. 1, the tape package 1 may include a tape wiring substrate 10 and a semiconductor chip 20 mounted on the tape wiring substrate 10.

The tape wiring substrate 10 may include a base film 100, a plurality of input wirings 110 and a plurality of output wirings 130 formed on the base film 100.

The base film 100 may be formed of a material having flexibility, and may include, for example, an organic material. The base film 100 may, for example, include polyimide, polyamide, polyester, or epoxy. The present general inventive concept is not limited to the tape wiring substrate 10 formed of the above-described materials. For example, the tape wiring substrate 10 may include glass, ceramic, or plastic, or any combination thereof. A package in which the semiconductor chip 20 is mounted on the tape wiring substrate 10 formed of glass may be referred to as a chip-on-glass (COG) package.

A mounting area where the semiconductor chip 20 is mounted may be formed in a center region of the base film 100. The mounting area may have a shape corresponding to that of the semiconductor chip 20, for example, may have a rectangular shape or a square shape. In other words, the base film 100 may include a package area PA and input/output test pad areas TP respectively formed at sides of the package area PA. In the package area PA, the semiconductor chip 20 is mounted in the mounting area and is electrically connected to the input wirings 110 and the output wirings 130 to form the tape package 1, which is one unit. The base film 100 may include a package area PA and input/output test pad areas TP respectively formed at sides of the package area PA. After an electrical test is performed on the tape package 1 by using the input/output test pad areas TP, boundaries between the package area PA and the input/output test pad areas TP are cut by cutting along a cutting line CL, thereby manufacturing the tape package 1.

The base film 100 may be a continuous roll of film in which a pattern is repeatedly formed. One unit of the tape package 1 may be formed within a unit length L1, and such a unit may be repeatedly formed on the base film 100. In order to continuously provide the base film 100 and to facilitate processing of the tape package 1, a plurality of sprocket holes 112 may be formed to be spaced apart from one another along edges of the base film 100. Although not shown in FIG. 1, the base film 100 may move (e.g., advance in a first direction) via rotation of sprockets (not illustrated) inserted into the sprocket holes 112. The sprocket holes 112 may also be used to determine and/or correct a position of the package area PA.

The input wirings 110 and the output wirings 130 may be disposed on the base film 100 and may extend into the mounting area to be electrically connected to the semiconductor chip 20. In this regard, the names of the input wirings 110 and the output wirings 130 are just examples, and the present general inventive concept is not limited thereto. That is, the input wirings 110 and the output wirings 130 may be reversed. The number of input wirings 110 and output wirings 130 and positions and arrangements thereof illustrated in FIG. 1 are just examples, and the present general inventive concept is not limited thereto.

The input wirings 110 can include connecting portions at both ends thereof. That is, each input wire of the input wirings 110 can include connections portions at both ends of the input wire. An end of the connection portion may be electrically connected to an input pad of the semiconductor chip 20, and the other end of the connection portion may be electrically connected to, for example, a driving circuit board of a display device. The output wirings 130 can include connection portions at both ends thereof. That is, each output wire of the output wirings 130 can include connections portions at both ends of the output wire. An end of the connection portion may be electrically connected to an output pad of the semiconductor chip 20, and the other end of the connection portion may be electrically connected to, for example, a glass panel of the display panel.

One or more of the input wirings 110 and one or more of the output wirings 130 can extend in the same direction to be electrically connected to the semiconductor chip 20. One of more of the output wirings 130 can extend in a direction that is different from that in which some of the input wirings 110 extend to be electrically connected to the semiconductor chip 20. One or more of the input wirings 110 and one or more of the output wirings 130 extend in different directions to be connected to external apparatuses.

The input wirings 110 and the output wirings 130 can include a metal selected from the group consisting of copper (Cu), aluminum (Al), gold (Au), tin (Sn), lead (Pb), silver (Ag), platinum (Pt), nickel (Ni), palladium (Pd), rubidium (Rb), and alloys thereof. The input wirings 110 and the output wirings 130 may be formed by adhering a metal thin film to a surface of the base film 100 through electro-deposition or thermal pressing, and by performing photolithography and etching processes thereon. The input wirings 110 and the output wirings 130 may further include a coating layer (not illustrated) formed of other metals with a predetermined thickness by using a plating method.

The input wirings 110 and the output wirings 130 may be covered by an insulating material (not illustrated), for example a solder resist. In this case, the connection portions of the input wirings 110 and the output wirings 130 may be exposed from the insulating material.

The semiconductor chip 20 may be a display driving driver semiconductor chip, for example, a source driving semiconductor chip, or a gate driving semiconductor chip. Alternatively, the semiconductor chip 20 may be a memory semiconductor chip, for example, a dynamic random access memory (DRAM), a static random access memory (SRAM), or a non-volatile memory semiconductor chip. The semiconductor chip 20 may be an interface controller (e.g., to control the interface unit 6400 illustrated in FIG. 36), a controller (e.g., controller 6100 illustrated in FIG. 36 and described below), or an input/output unit controller (e.g., a controller to control the input/output unit 6200 illustrated in FIG. 36 and described below). The semiconductor chip 20 may be a processor, a field programmable gate array, a programmable logic device, or a controller.

Figure 2:
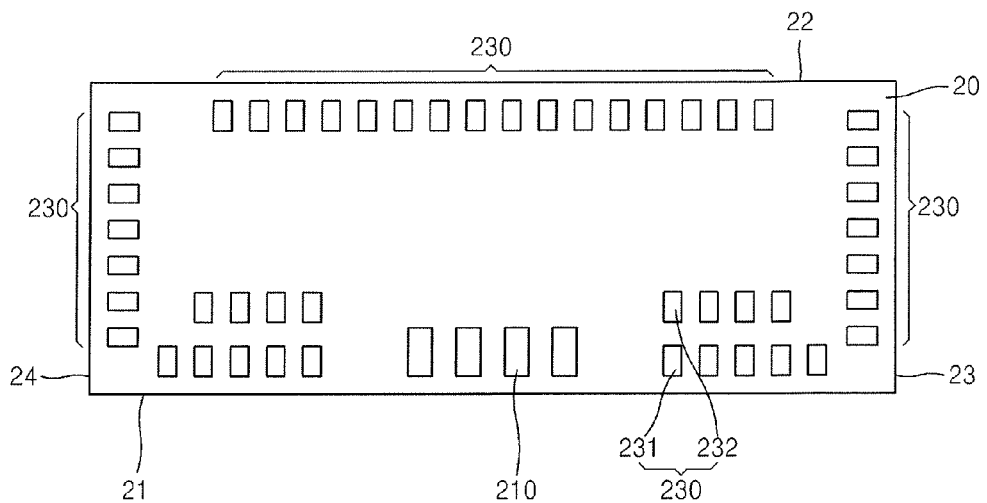
FIG. 2 is a rear view illustrating a semiconductor chip included in the tape package of FIG. 1, according to exemplary embodiments of the present general inventive concept.

FIG. 2 is a rear view illustrating the semiconductor chip 20 included in the tape package 1 of FIG. 1, according to exemplary embodiments of the present general inventive concept.

Referring to FIG. 2, the semiconductor chip 20 includes an active surface in which a circuit element layer is formed and a rear surface that is opposite to the active surface and that is attached to the tape wiring substrate 10. The semiconductor chip 20 may include input pads 210 and output pads 230 on the rear surface. The input pads 210 and the output pads 230 may be electrically connected to circuit structures (not illustrated) formed inside the semiconductor chip 20. The input pads 210 and the output pads 230 may include a metal selected from the group consisting of copper (Cu), aluminum (Al), gold (Au), tin (Sn), lead (Pb), silver (Ag), platinum (Pt), nickel (Ni), palladium (Pd), rubidium (Rb), and alloys thereof. In this regard, the names of the input pads 210 and the output pads 230 are just examples, and the present general inventive concept is not limited thereto. That is, functions of the input pads 210 and the output pads 230 may be reversed. The number of input pads 210 and output pads 230 and positions and arrangements thereof illustrated in FIG. 2 are just examples, and the present general inventive concept is not limited thereto.

The input pads 210 and the output pads 230 may be respectively connected to the input wirings 110 and the output wirings 130 of FIG. 1 disposed on the base film 100. Accordingly, the numbers of input pads 210 and output pads 230 may respectively correspond to the numbers of input wirings 110 and output wirings 130. A bump (not illustrated) may be formed between the input wirings 110 and the input pads 210 to connect the input wirings 110 and the input pads 210. In addition, a bump (not illustrated) may be formed between the output wirings 130 and the output pads 230 to connect the output wirings 130 and the output pads 230. One of ordinary skill in the art would understand that connection between the wirings and the pads in the present specification means that the wirings and pads are physically or directly connected to each other, and also means that the wirings and pads are electrically connected to each other, for example, by a third layer interposed between the wiring and the pads.

The semiconductor chip 20 may include a first edge 21 and a second edge 22 that face each other, and a third edge 23 and a fourth edge 24 that face each other. The third edge 23 and the fourth edge 24 may form predetermined angles with the first edge 21 and the second edge 22. For example, as illustrated in FIG. 2, the third edge 23 and the fourth edge 24 may be perpendicular to the first edge 21 and the second edge 22.

The input pads 210 and the output pads 230 may be disposed adjacent to the first edge 21. As illustrated in FIG. 2, the output pads 230 may be disposed adjacent to the second edge 22, the third edge 23, and the fourth edge 24. The input pads 210 may be disposed at a predetermined position (e.g., in a central area) between the output pads 230. The output pads 230 adjacent to the first edge 21 may be arranged in a plurality of rows, for example, in two or more rows. The output pads 230 may include first output pads 231 arranged in a first row to be adjacent to the first edge 21 and second output pads 232 arranged in a second row to be farther spaced apart from the first edge 21 than the first output pads 231. The second output pads 232 may be arranged collinearly with respect to the first output pads 231 in a vertical direction with respect to the first edge 21. That is, the second output pads 232 may be arranged along the same axes as the first output pads 231, where the second output pads 232 are spaced from the first edge 21 by a greater distance than the first output pads 231 are spaced from the first edge 21. However, the arrangement of the output pads 230 is just an example, and the present general inventive concept is not limited thereto. Some of the first output pads 231 may be not arranged collinearly with the second output pads 232. The arrangements of the input pads 210 and the output pads 230 are just examples, and the present general inventive concept is not limited thereto.

The input pads 210 and the output pads 230 may have any of various shapes, for example, a rectangular shape, a square shape, a circular shape, or an oval shape. The input pads 210 and the output pads 230 may be the same size or different sizes. In general, when the semiconductor chip 20 is a display driving driver semiconductor chip, the input pads 210 and the output pads 230 may have a rectangular shape, and the input pads 210 may be bigger than the output pads 230 in size. However, the shapes and sizes of the input pads 210 and the output pads 230 are just examples, and the present general inventive concept is not limited thereto.

Figure 3:
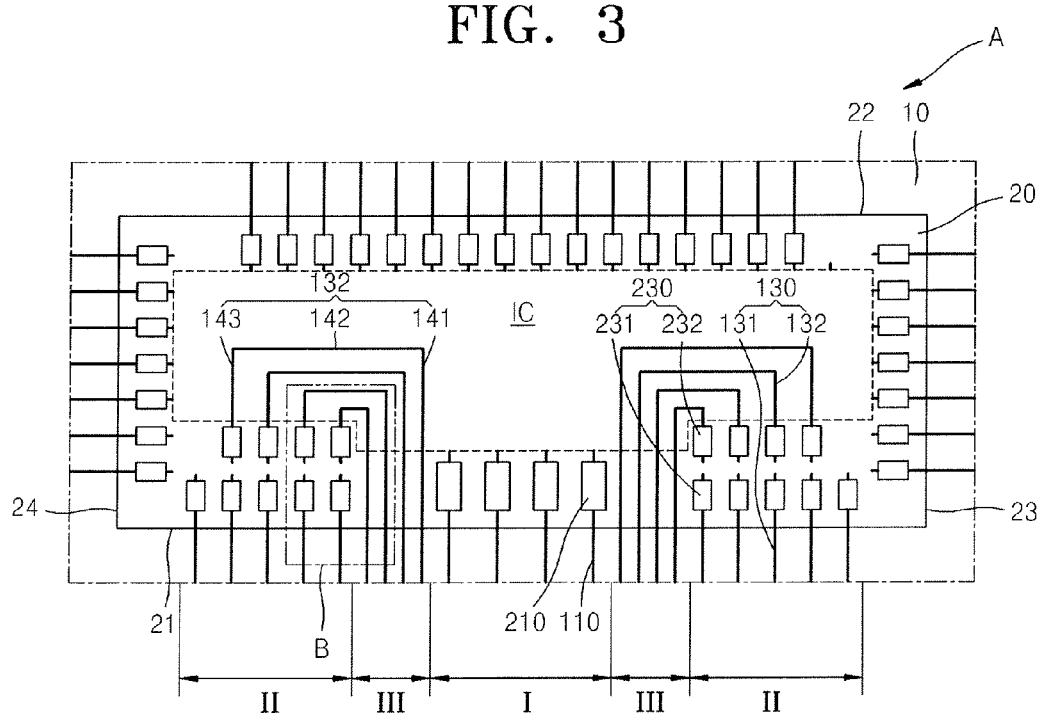
FIG. 3 is an enlarged plane view illustrating an A area of the tape package of FIG. 1, according to exemplary embodiments of the inventive concept.

FIG. 3 is an enlarged plane view of an A area of the tape package 1 of FIG. 1, according to exemplary embodiments of the present general inventive concept. The semiconductor chip 20 illustrated in FIG. 3 corresponds to the semiconductor chip 20 described with reference to FIG. 2. FIG. 3 is a view illustrating an electrical connection between the input wirings 110 of the tape wiring substrate 10 and the input pads 210 of the semiconductor chip 20 and an electrical connection between the output wirings 130 of the tape wiring substrate 10 and the output pads 230 of the semiconductor chip 20. Accordingly, other components of the semiconductor chip 20 other than the input pads 210 and the output pads 230 are omitted in FIG. 3. In FIG. 3, the number of input wirings 110, output wirings 130, input pads 210, and output pads 230 is just an example.

Referring to FIG. 3, the input pads 210 and the output pads 230 may be disposed adjacent to the first edge 21 of the semiconductor chip 20 mounted on the tape wiring substrate 10. The input wirings 110 respectively connected to the input pads 210 and the output wirings 130 respectively connected to the output pads 230 may be disposed adjacent to the first edge 21 of the semiconductor chip 20. Each of the output wirings 130 respectively connected to the output pads 230 adjacent to the first edge 21 may include a first output wiring 131 and a second output wiring 132. The output pads 230 can be disposed in one row adjacent along each of the second edge 22, the third edge 23, and the fourth edge 24, where the input pads 210 are not disposed adjacent thereto.

The input pads 210 may be disposed in one row to be adjacent to the first edge 21. However, this is just an example, and the present general inventive concept is not limited thereto. That is, the input pads 210 may be central pads disposed in the middle of the semiconductor chip 20.

The output pads 230 adjacent to the first edge 21 may be arranged in a plurality of rows, for example, two rows. That is, the output pads 230 adjacent to the first edge 21 may include the first output pads 231 arranged in a first row to be adjacent to the first edge 21 and the second output pads 232 arranged in a second row to be farther spaced apart from the first edge 21 than the first output pads 231. One or more of the output pads 230 adjacent to the first edge 21 may be disposed adjacent to each other. For example, one or more of the first output pads 231 may be disposed adjacent to each other and one or more of the second output pads 232 may be disposed adjacent to each other. That is, the first output pads 231 may be respectively disposed along a plurality of axes, and the second output pads 232 may be correspondingly respectively disposed along the plurality of axes, where the second output pads 232 are spaced from the first edge 21 by a greater distance that the first output pads 231. Each axis may include the first output pad 231 and the second output pad 232.

First sides of the input wirings 110 may extend toward portions of the input pads 210 relatively close to the first edge 21, to be respectively connected to the input pads 210. Second sides of the input wirings 110 may extend out of the semiconductor chip 20. The input wirings 110 may be straight lines or may take any suitable path. However, the present general inventive concept is not limited thereto, and the input wirings 110 may, for example, be bent lines (e.g., where the bent lines have one or more bends).

First sides of the first output wirings 131 may extend toward portions of the first output pads 231 relatively close to the first edge 21, to be respectively connected to the first output pads 231. Second sides of the first output wirings 131 may extend out of the semiconductor chip 20. The first output wirings 131 may be straight lines. However, the inventive concept is not limited thereto, and the first output wirings 131 may, for example, be configured as bent lines (e.g., where the bent lines have one or more bends).

First sides of the second output wirings 132 may extend toward portions of the second output pads 232 spaced from (e.g., relatively far from) the first edge 21, to be respectively connected to the second output pads 232. Second sides of the second output wirings 132 may extend out of the semiconductor chip 20. Each of the second output wirings 132 may be a bent line including a first portion 141, a second portion 142, and a third portion 143. The second output wirings 132 will now be described in detail with reference to FIG. 4.

Hereinafter, a relative position relationship between the input pads 210, the output pads 230, and the second output wirings 132 will be described. In the present specification, an area including the input pads 210 is referred to as an input pad area I, areas including the output pads 230 are referred to as output pad areas II, and areas where the second output wirings 132 extend toward the first edge 21 of the semiconductor chip 20 are referred to as output wiring areas III. Input pad area I, output pad areas II, and output wiring areas III are illustrated, for example, in FIG. 3.

The input pad area I may be disposed in a central area to be adjacent to the first edge 21 of the semiconductor chip 20 and may be disposed between the output pad areas II. In the input pad area I, the input pads 210 may be disposed adjacent to one another. In the output pad areas II, the output pads 230 may be disposed adjacent to one another. In the output wiring areas III, the second output wirings 132 may be disposed adjacent to one another. The input pad area I and the output wiring areas III may be adjacent to each other. The output pad areas II and the output wiring areas III may be adjacent to each other. The input pad area I and the output pad areas II may be spaced apart from each other by interposing the output wiring areas III. Thus, the second output wirings 132 may be disposed between the input pads 210 and the output pads 230. The input pads 210 disposed in outermost regions in the input pad area I (e.g., where the outermost regions are portions of the input pad area I that are closest to the output wiring areas III) may be adjacent to the second output wirings 132 disposed in outermost regions in the output wiring areas III (e.g., where the outermost regions of the output wiring areas III are portions of the output wiring areas III that are closest to the input pad area I). The output pads 230 disposed in outermost regions in the output pad areas II (e.g., where the outermost regions are portions of the output pad areas II that are closes to output wiring areas III) may be adjacent to the second output wirings 132 disposed in outermost regions in the output wiring areas III (e.g., where the outermost regions are portions of the output wiring areas III are closests to the output pad areas II). In other words, the input pad area I, the output wiring areas III, and the output pad areas II may be sequentially disposed to be adjacent to the first edge 21 of the semiconductor chip 20 from a central area toward an outer area, and thus the input pads 210, the second output wirings 132, and the output pads 230 may be sequentially disposed to be adjacent to the first edge 21 of the semiconductor chip 20 from the central area toward the outer area.

The second output wirings 132 included in each output wiring area III may be disposed adjacent to one another. The second output wirings 132 included in each output wiring area III may extend in the same direction to be connected to the second output pads 232, respectively. In other words, all of the second output wirings 132 included in the output wiring area III disposed on the left of the input pad area I can be bent in a left direction to be connected to the second output pads 232, respectively. The second output wirings 132 included in the output wiring area III disposed on the right of the input pad area I can be bent in a right direction to be connected to the second output pads 232, respectively. In the present specification, the 'left' and the 'right' may be referred to as relative directions based on the drawing.

In FIG. 3, an "IC" area is an area where circuit structures (not illustrated) may be disposed in the semiconductor chip 20. The circuit structures may not overlap with an area where the input pads 210 and the output pads 230 on the semiconductor chip 20 are disposed so as not to be affected by the input pads 210 and the output pads 230. The input wirings 110 and the output wirings 130 disposed on the tape wiring substrate 10 may not affect the circuit structures. Accordingly, one or more of the second output wirings 132 may be disposed in the IC area. Therefore, the tape package (e.g., tape package 1 illustrated in FIG. 1) according to the present general inventive concept may provide more pads and increase the area where the circuit structures are disposed on the semiconductor chip.

Figure 4:
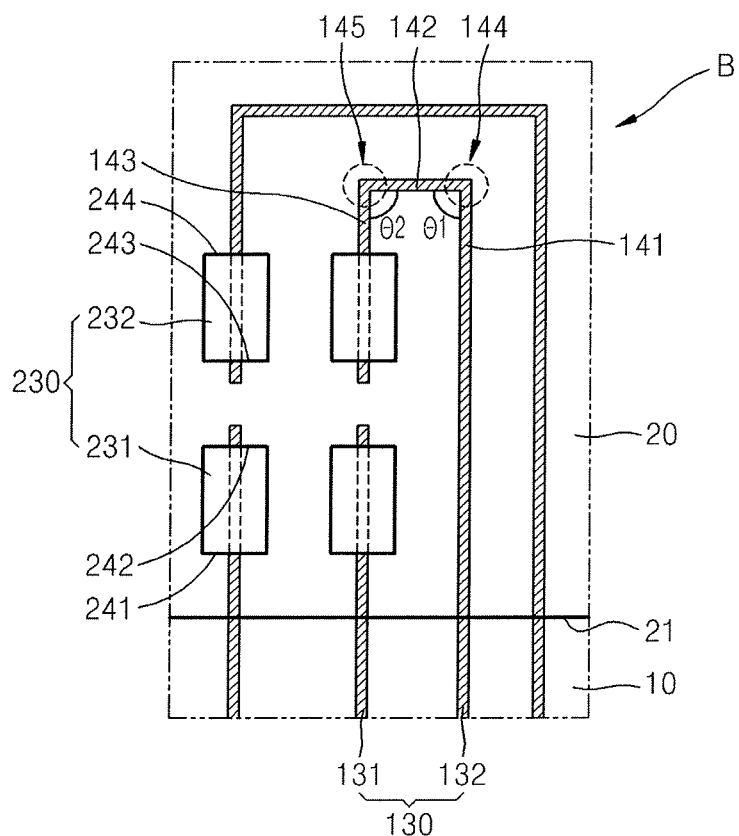
FIG. 4 is a schematic enlarged view illustrating a B area of FIG. 3, according to exemplary embodiments of the present inventive concept.

FIG. 4 is a schematic enlarged view illustrating a B area of FIG. 3, according to exemplary embodiments of the present general inventive concept.

Referring to FIG. 4, the first output pads 231 and the second output pads 232 may be disposed to face each other in a vertical direction with respect to the first edge 21 of the semiconductor chip 20. The second output pads 232 may be arranged collinearly with respect to the first output pads 231 in a vertical direction with respect to the first edge 21. That is, each column of output pads including the first output pads 231 and the second output pads 232 may have the first and second output pads arranged along the same axis. The first output pads 231 may be arranged in a first row to be adjacent to the first edge 21, and the second output pads 232 may be arranged in a second row spaced apart from the first edge 21.

The first output wirings 131 may extend in a vertical direction with respect to the first edge 21 to be connected to the first output pads 231, respectively. The first output wirings 131 may extend to pass through the first output pads 231. In other words, the first output wirings 131 may be connected to first sides 241 of the first output pads 231 close to the first edge 21. The first output wirings 131 may extend to second sides 242 of the first output pads 231 farther from the first edge 21 than the first sides 241, passing through the first output pads 231 (illustrated in dotted lines) and may extend out from the second sides 242. The first output wirings 131 may have a shape so as to increase an electrical connection between the first output wirings 131 and the first output pads 231.

The second output wirings 132 may have a bent shape and may include one or more bending portions. For example, each of the second output wirings 132 may include the first portion 141, the second portion 142, and the third portion 143.

The first portions 141 of the second output wirings 132 may extend in a first direction from the first edge 21, for example, in a vertical direction with respect to the first edge 21. The first portions 141 may extend to be spaced apart from the second output pads 232 passing by the second output pads 232. In exemplary embodiments of the present general inventive concept, the first portions 141 may not connected to the second output pads 232. In other words, the first portions 141 may extend from the first edge 21 to be spaced apart from third sides 243 of the second output pads 232 close to the first edge 21 and fourth sides 244 of the second output pads 232 far from the first edge 21, by passing by the third and fourth sides 243 and 244. The first output wirings 131 and the first portions 141 of the second output wirings 132 may extend parallel to each other.

The second portions 142 of the second output wirings 132 may be connected to the first portions 141 so as to form bending portions 144 in parts of the first portions 141, for example, in end areas of the first portions 141, and may extend in a second direction having a first angle θ1 with respect to the first direction. The first angle θ1 may be an arbitrary angle, for example, 90°. That is, the bending portions 144 may be a perpendicular type. The second portions 142 may extend toward the second output pads 232, but may not be connected to the second output pads 232.

The third portions 143 of the second output wirings 132 may be connected to the second portions 142 so as to form bending portions 145 in parts of the second portions 142, for example, in end areas of the second portions 142, and may extend in a third direction having a second angle θ2 with respect to the second direction. The second angle θ2 may be an arbitrary angle, for example, 90°. That is, the bending portions 145 may be a perpendicular type. In exemplary embodiments of the present general inventive concept, the first angle θ1 and the second angle θ2 may have the same value. The third direction and the first direction may be anti-parallel (i.e., not parallel) to each other, but the present general inventive concept is not limited thereto. The third portions 143 may extend toward the second output pads 232 to be connected to the second output pads 232. The third portions 143 may extend to pass through the second output pads 232. In other words, the third portions 143 of the second output wirings 132 may be connected to the fourth sides 244 of the second output pads 232, which are farther from the first edge 21 than the third sides 243. The third portions 143 may extend to the third sides 243 of the second output pads 232, which are closer to the first edge 21 than the fourth sides 244, by passing through the second output pads 232 (as illustrated by the dotted line in FIG. 4) and may extend out from the third sides 243. The second output wirings 132 may have a shape so as to increase an electrical connection between the second output wirings 132 and the second output pads 232.

Consequently, the first output wirings 131 and the second output wirings 132 may extend in opposite directions toward the first output pads 231 and the second output pads 232, respectively, to be connected thereto. The first output pads 231 may be connected to the first output wirings 131 at portions that are close to the first edge 21, that is, at the first sides 241, and the second output pads 232 may be connected to the second output wirings 132 at portions that are spaced from the first edge 21 (e.g., far from the first edge 21), that is, at the fourth sides 244.

Referring back to FIGS. 3 and 4, the second output pads 232 arranged in the second row may be connected to the second output wirings 132 through the above-described method. In this regard, the first portions 141 of the second output wirings 132 may be arranged so as to be adjacent to one another and may also be adjacent to the input pads 210. The second portions 142 of the second output wirings 132 may be arranged to be adjacent to one another. The second portions 142 of the second output wirings 132 may extend in the same direction. The third portions 143 of the second output wirings 132 may be arranged adjacent to one another. The third portions 143 of the second output wirings 132 may extend in the same direction to be connected to the second output wirings 132.

The second output wirings 132 may be connected to the second output pads 232 in a direction parallel to the direction in which the sprocket holes 112 of FIG. 1 are arranged. In general, the direction in which the sprocket holes 112 are arranged has a greater fabrication error than a direction perpendicular thereto. That is, any errors in fabricating the input wirings 110, the output wirings 130, and the semiconductor chip 20 of the tape package may generally occur more frequently in the direction in which the sprocket holes 112 are disposed on the base film 100 than in a direction that is perpendicular thereto. The present general inventive concept may provide the second output wirings 132 that are disposed (e.g., having long lengths) in the direction in which the sprocket holes 112 are arranged. That is, the second output wirings 132 may include the third portions 143, as well as first portion 141 and second portion 142, and thus errors due to movement of the sprockets 112 may be reduced (e.g., by having the first, second, and third portions 141, 142, and 143 respectively, disposed in different directions), thereby providing a reliable electrical connection between the second output wiring 132 and the second output pad 232.

Figure 5:
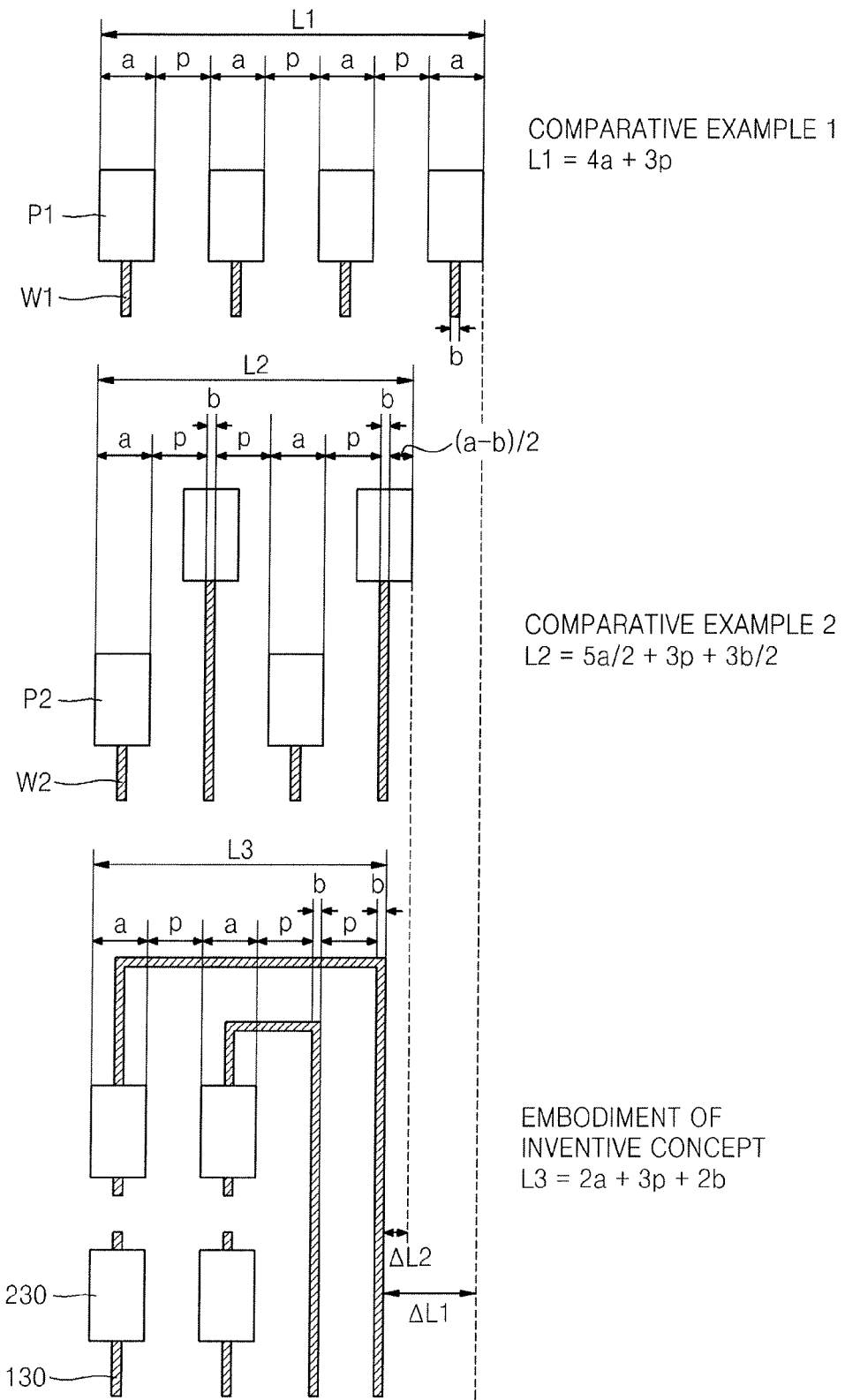
FIG. 5 is a view illustrating a reduction of a size of a pad area according to arrangement of pads and wirings, with respect to a tape package in comparison with comparative examples, according to exemplary embodiments of the present general inventive concept.

FIG. 5 is a view illustrating reduction of a size of a pad area according to arrangement of pads and wirings, with respect to the tape package 1 in comparison with comparative examples, according to exemplary embodiments of the present general inventive concept. In FIG. 5, 'a' denotes a width of a pad, 'p' denotes a minimum pitch, and 'b' denotes a width of a wiring. In order to clearly describe the inventive concept, a case where there are four pads will be described.

In a comparative example 1, four pads P1 are arranged in a row collinearly, and may be connected to wirings W1, respectively. The minimum pitch p is defined between the pads P1. Accordingly, a total length L1 of a pad area in the comparative example 1 is represented by Equation 1 below.

$$L1 = 4a + 3p \quad (1)$$

In a comparative example 2, four pads P2 are arranged in a row. The arrangement of the four pads P2 has a zigzag shape. The minimum pitch p is defined between the pads P2 and wirings W2. Accordingly, a total length L2 of a pad area in the comparative example 2 is represented by Equation 2 below.

$$L2 = \frac{5a}{2} + 3p + \frac{3b}{2} \quad (2)$$

In exemplary embodiments of the present general inventive concept, four pads 230 are arranged in two lines, and the arrangement of the four pads 230 has a rectangular or square shape as illustrated in FIG. 4. The minimum pitch p is defined between the pads 230, between the wirings 130, and between the pads 230 and the wiring 130. Accordingly, a total length L3 of a pad area in exemplary embodiments of the present general inventive concept is represented by Equation 3 below.

$$L3 = 2a + 3p + 2b \quad (3)$$

When Equation 3 is subtracted from Equation 1, Equation 4 is obtained. Equation 4 corresponds to a difference ΔL1 between the total length L1 of the pad area in the comparative example 1 and the total length L3 of the pad area in exemplary embodiments of the present general inventive concept.

$$\Delta L1 = L1 - L3 = 2a - 2b \quad (4)$$

When Equation 3 is subtracted from Equation 2, Equation 5 is obtained. Equation 5 corresponds to a difference ΔL1 between the total length L2 of the pad area in the comparative example 2 and the total length L3 of the pad area in exemplary embodiments of the present general inventive concept.

$$\Delta L2 = L2 - L3 = \frac{a}{2} - \frac{b}{2} \quad (5)$$

In general, a width 'a' of a pad is greater than a width 'b' of a wiring, which is illustrated in FIG. 5. In exemplary embodiments of the present general inventive concept, the length L3 of the pad area is illustrated to be reduced by the difference ΔL1, that is, 2a-2b, compared to the comparative example 1 and is illustrated to be reduced by the difference ΔL2, that is, $$\frac{a}{2} - \frac{b}{2},$$

compared to the comparative example 2, with respect to four pads. Thus, the tape package 1 according to the exemplary embodiments of the present general inventive concept has a reduced pad area size. In other words, more pads may be arranged on the semiconductor chip 20.

Figure 6:
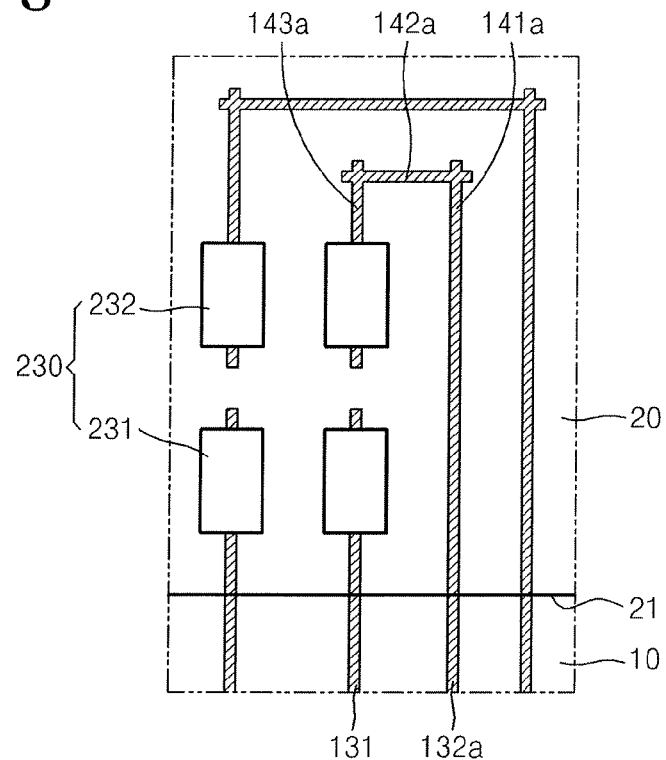
FIGS. 6 through 9 are schematic views illustrating different examples of second output wirings of FIG. 4, according to exemplary embodiments of the present general inventive concept.
Figure 7:
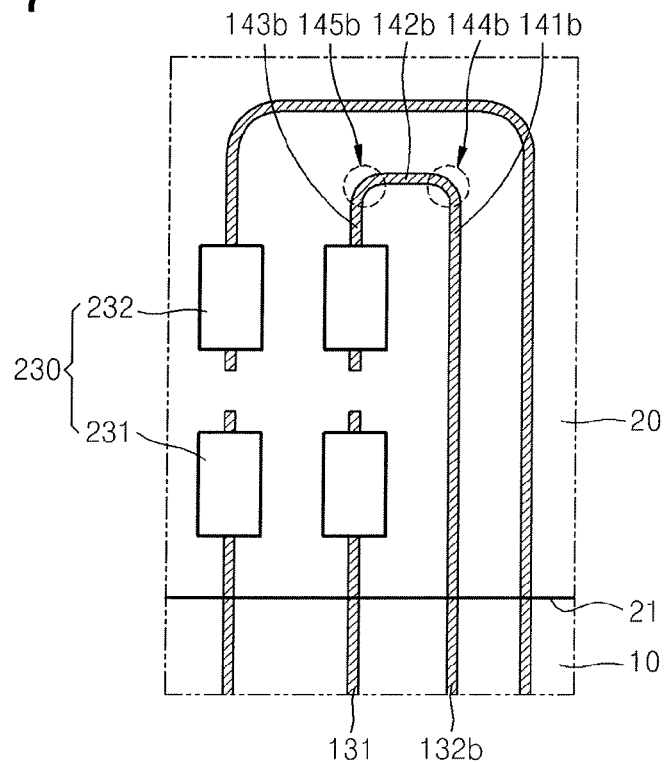
Figure 8:
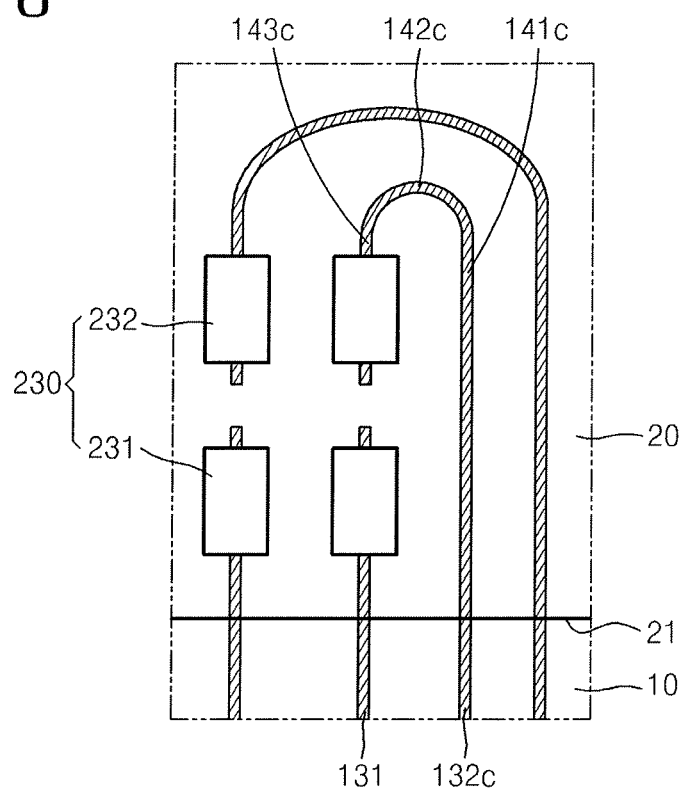
Figure 9:
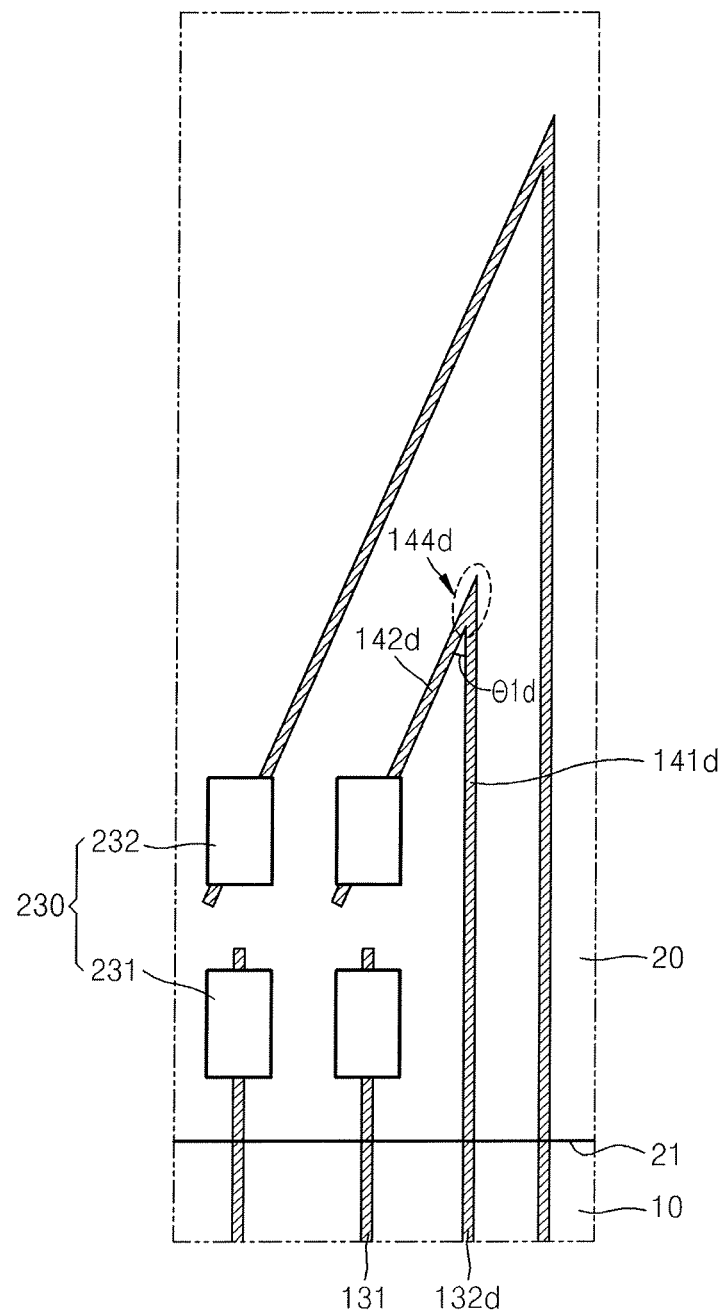

FIGS. 6 through 9 are schematic views illustrating different examples of the second output wirings 132 of FIG. 4, according to exemplary embodiments of the present general inventive concept. The descriptions with regard to the above exemplary embodiments will not be repeated here. The exemplary embodiments of the second output wirings 132 may be applied to some embodiments with regard to second input wirings 312 (see FIGS. 17 through 20) to be described below. The exemplary embodiments of the bending portions illustrated in FIGS. 6-9 may be combined in any suitable matter. For example, bending portions of output wirings having angles (e.g., as illustrated in FIGS. 4 and 9) may be combined with other output wirings having curved bending portions (e.g., as illustrated in FIGS. 7-8).

Referring to FIG. 6, second portions 142a may be connected to first portions 141a and third portions 143a of second output wirings 132a so as to intersect them. When the exemplary embodiment illustrated in FIG. 6 is compared with the exemplary embodiment illustrated and described with reference to FIG. 4, the exemplary embodiment of FIG. 6 is different in that the second portions 142a are connected to the first portions 141a and/or the third portions 143a so as to intersect them at terminals of the first portions 141a and/or the third portions 143a. The second portions 142a and the first portions 141a or the third portions 143a may intersect at the middle of the first portions 141a or the third portions 143a or at ends thereof. In the exemplary embodiment illustrated in FIG. 6, when the second output wirings 132a are formed, the first portions 141a and the third portions 143a extending in one direction are formed, and the second portions 142a extending in another direction are then formed, or the order may be reversed, thereby decreasing possibility of a short circuit in wiring patterns, non-uniformity, and manufacturing errors between the wiring patterns and design patterns that may occur when overlapped or intersected wiring patterns are formed together.

Referring to FIG. 7, a plurality of second output wirings 132b each may include one or more bending portions 144b and 145b. When the exemplary embodiment illustrated in FIG. 7 is compared with the above embodiment described with reference to FIG. 4, the exemplary embodiment illustrated in FIG. 7 is different in that the bending portions 144b and 145b are not a perpendicular type. That is, at least some of the bending portions 144b and 145b may be curved types. In other words, the curved type bending portions 144b may be formed between first portions 141b and second portions 142b.

The curved type bending portions 145b may be formed between the second portions 142b and third portions 143b. For example, the bending portions 144 and 145 are illustrated as a perpendicular type in FIG. 4. However, if bending portions illustrated as a perpendicular type on design patterns are substantially manufactured, the bending portions may be illustrated as the curved type bending portions 144b and 145b of FIG. 7. Alternatively, the bending portions are designed as curved types on the design patterns, and thus the curved type bending portions 144b and 145b are manufactured.

Referring to FIG. 8, a plurality of second output wirings 132c each may include a first portion 141c, a second portion 142c, and a third portion 143c. When the exemplary embodiment illustrated in FIG. 8 is compared with the above exemplary embodiment described with reference to FIG. 4, the exemplary embodiment of FIG. 8 is different in that the second portions 142c are curved. Although areas of the second output wirings 132c are increased due to the curved second portions 142c, the areas of the second output wirings 132c do not affect formation of a circuit structure of the semiconductor chip 20 as described above. Accordingly, the second output wirings 132c each having a curved portion may be formed over a wide area by using a residual area at a rear surface of the semiconductor chip 20, and thus defects of the second output wirings 132c, such as possibility of a short circuit and non-uniformity, may be decreased, thereby increasing an electrical reliability.

Referring to FIG. 9, a plurality of second output wirings 132d each may include a first portion 141d and a second portion 142d. When the exemplary embodiment of FIG. 9 is compared with the exemplary embodiment described with reference to FIG. 4, the present embodiment is different in that the second output wirings 132d do not include the third portions 143 (see FIG. 4). The first portions 141d of the second output wirings 132d may extend in a first direction from the first edge 21, for example, in a vertical direction with respect to the first edge 21. The first portions 141d extend to be spaced apart from the second output pads 232 and also extend to pass through the second output pads 232. However, the first portions 141d are not connected to the second output pads 232. The second portions 142d of the second output wirings 132d are connected to the first portions 141d so as to form bending portions 144d at parts of the first portions 141d, for example, at end areas, and extend in a second direction having a third angle θ1d with respect to the first direction. The third angle θ1d may be an arbitrary angle. The second portions 142d may extend toward the second output pads 232 to be connected to the second output pads 232. The second portions 142d may extend to pass through the second output pads 232.

Figure 10:
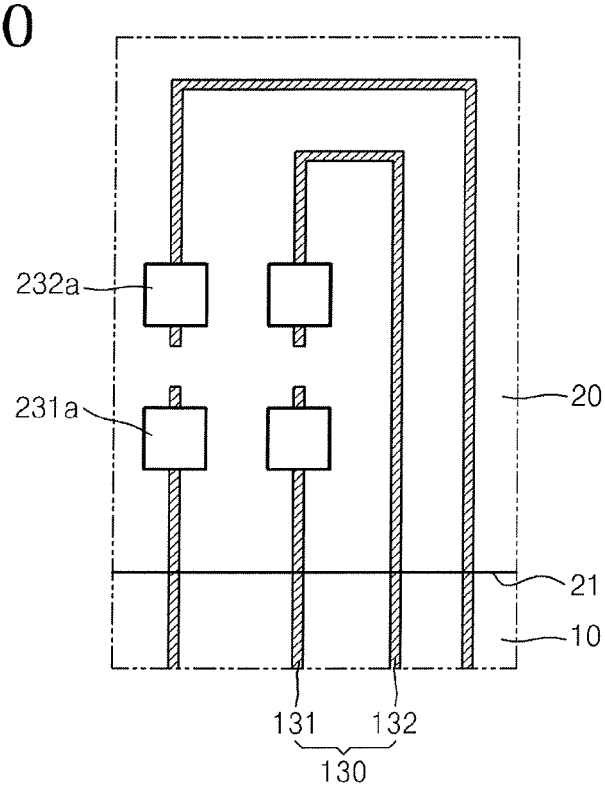
FIGS. 10 through 12 are schematic view illustrating different examples of output pads of FIG. 4, according to exemplary embodiments of the present general inventive concept.
Figure 11:
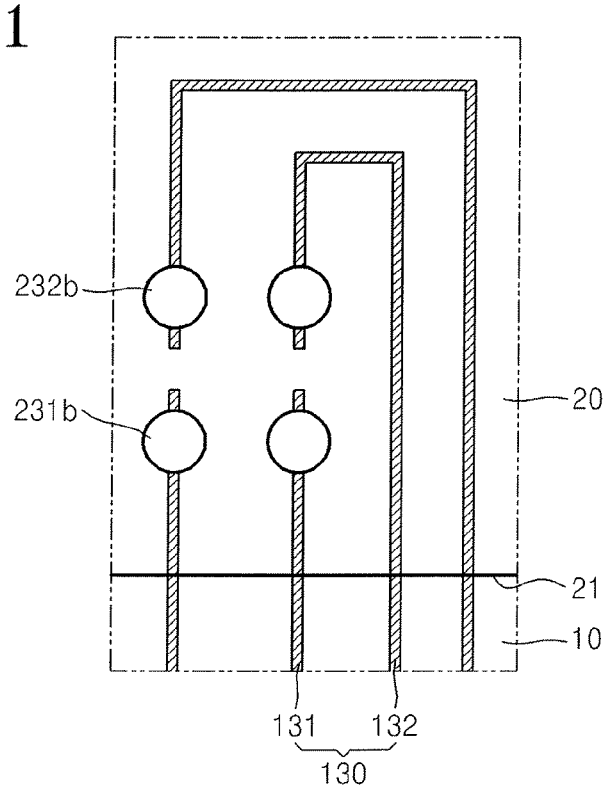
Figure 12:
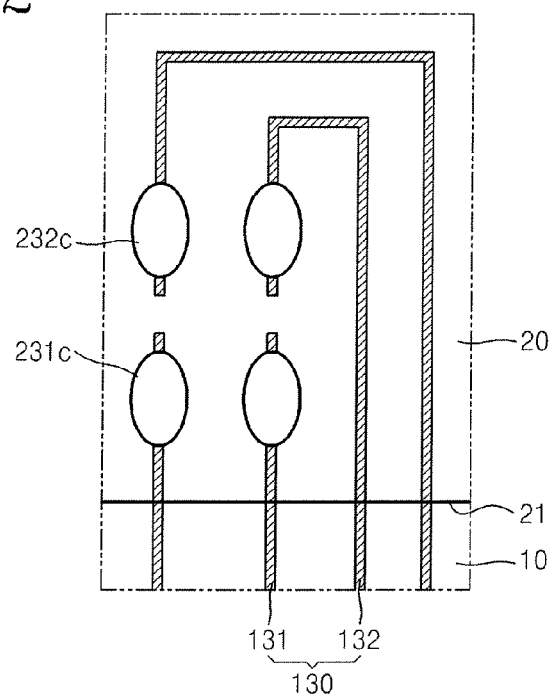

FIGS. 10 through 12 are schematic views illustrating different examples of the output pads 230 of FIG. 4, according to exemplary embodiments of the inventive concept.

Referring to FIGS. 10 through 12, first output pads 231a, 231b, and 231c and second output pads 232a, 232b, and 232c may respectively have square shapes illustrated in FIG. 10, circular shapes illustrated in FIG. 11, and oval shapes illustrated in FIG. 12. In particular, a pad having a square shape may be usually used in a memory semiconductor chip. However, this is just an example, and the present general inventive concept is not limited thereto. The inventive concept may include cases where these shapes are combined to form one tape package. The present general inventive concept may also include cases where the shapes of the output pads are applied to input pads described in the present specification. For example, a tape package may include output pads having at least one of square shapes, circular shapes, and oval shapes.

The present general inventive concept may include cases where one or more of the exemplary embodiments illustrated in FIGS. 10-12 are combined with the above embodiments as illustrated and described with reference to FIGS. 6 through 9.

FIGS. 13 through 16 are enlarged plane views illustrating the A area of the tape package 1 of FIG. 1, according to exemplary embodiments of the inventive concept. The semiconductor chip 20 illustrated in FIGS. 13 through 16 corresponds to the semiconductor chip 20 illustrated and described with reference to FIG. 2.

The exemplary embodiments illustrated in FIGS. 13 through 16 illustrate cases where relative position relationships between the input pads 210, the output pads 230, and the second output wirings 132 are different, as compared to the exemplary embodiment illustrated in FIG. 3. Accordingly, the descriptions with regard to the exemplary embodiment described with reference to FIG. 3 will not be repeated here. The present general inventive concept also includes cases where the embodiments of FIGS. 6 through 9 with regard to the second output wirings 132 are combined and cases where the exemplary embodiments of FIGS. 10 through 12 with regard to the output pads 230 are combined together.

Figure 13:
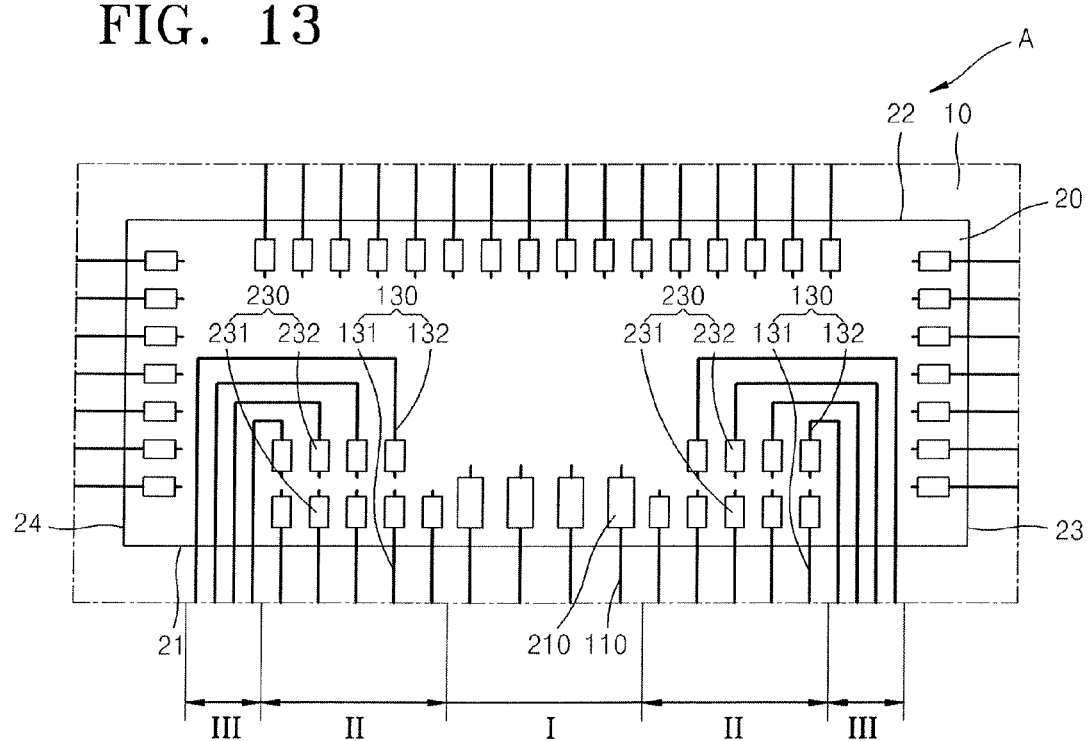
FIGS. 13 through 16 are enlarged plane views illustrating the A area of the tape package of FIG. 1, according to exemplary embodiments of the present general inventive concept.

Referring to FIG. 13, the input pad area I may be disposed in a central area to be adjacent to the first edge 21 of the semiconductor chip 20, and may be disposed between the output pad areas II. In the input pad area I, the input pads 210 may be disposed adjacent to one another. In the output pad areas II, the output pads 230 may be disposed adjacent to one another. In the output wiring areas III, the second output wirings 132 may be disposed adjacent to one another. The input pad area I and the output pad areas II may be adjacent to each other. The output pad areas II and the output wiring areas III may be adjacent to each other. The input pad area I and the output wiring areas III may be spaced apart from each other by interposing the output pad areas II. Thus, the output pads 230 connected to the second output wirings 132 may be disposed in an area between the input pads 210 and the second output wirings 132. The input pads 210 disposed in outermost regions in the input pad area I may be adjacent to the output pads 230 disposed in outermost regions in the output pad areas II. The output pads 230 disposed in outermost regions in the output pad areas II may be adjacent to the second output wirings 132 disposed in outermost regions in the output wiring areas III. In other words, the input pad area I, the output pad areas II, and the output wiring areas III may be sequentially disposed to be adjacent to the first edge 21 of the semiconductor chip 20 from a central area toward an outer area, and thus the input pads 210, the output pads 230, and the second output wirings 132 may be sequentially disposed to be adjacent to the first edge 21 of the semiconductor chip 20 from the central area toward the outer area.

The second output wirings 132 included in each output wiring area III may be disposed adjacent to one another. The second output wirings 132 included in each output wiring area III may extend in the same direction to be connected to the second output pads 232, respectively. In other words, all of the second output wirings 132 included in the output wiring area III disposed on the left of the input pad area I are bent in a right direction to be connected to the second output pads 232, respectively. All of the second output wirings 132 included in the output wiring area III disposed on the right of the input pad area I are bent in a left direction to be connected to the second output pads 232, respectively.

Figure 14:
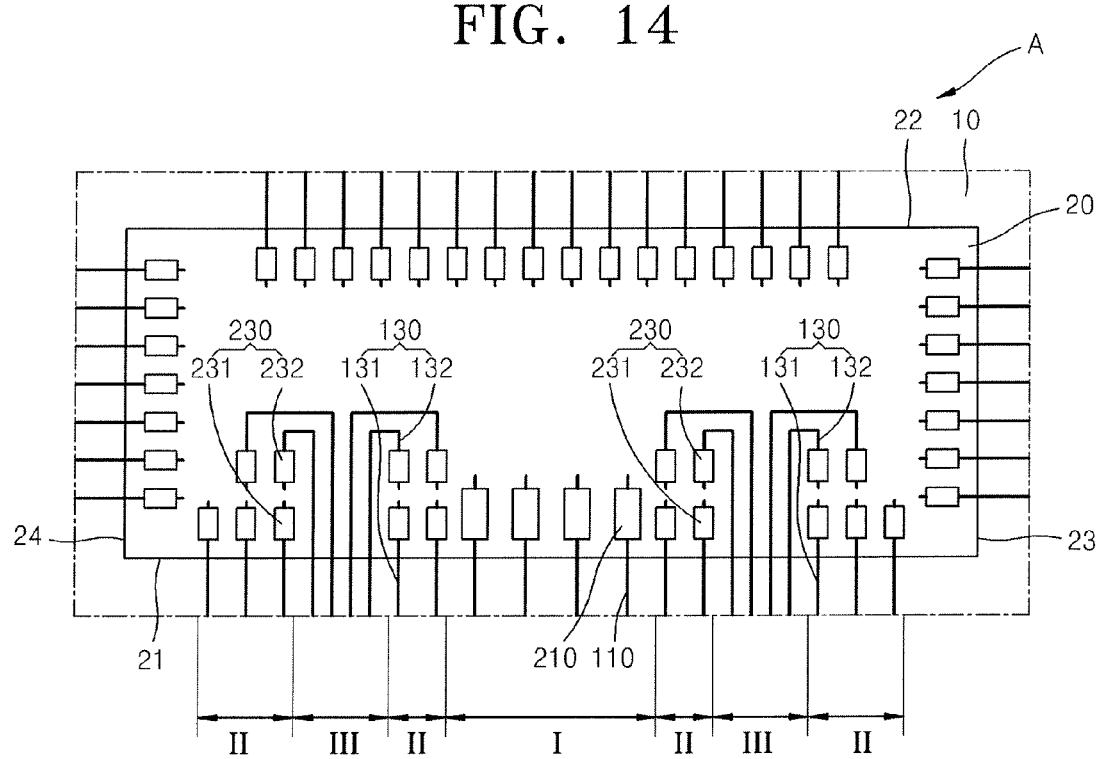

Referring to FIG. 14, the input pad area I including the input pads 210 may be disposed in a central area to be adjacent to the first edge 21 of the semiconductor chip 20, and may be disposed between the output pad areas II. In the input pad area I, the input pads 210 may be disposed adjacent to one another. In the output pad areas II, the output pads 230 may be disposed adjacent to one another. In the output wiring areas III, the second output wirings 132 may be disposed adjacent to one another. The input pad area I and the output pad areas II may be adjacent to each other. The output pad areas II and the output wiring areas III may be adjacent to each other. The input pad area I and the output wiring areas III may be spaced apart from each other by interposing the output pad areas II. The output wiring areas III may be disposed between the output pad areas II. The input pads 210 disposed in outermost regions in the input pad area I may be adjacent to the output pads 230 disposed in outermost regions in the output pad areas II. The output pads 230 disposed in outermost regions in the output pad areas II may be adjacent to the second output wirings 132 disposed in outermost regions in the output wiring areas III. In other words, the input pad area I, the output pad areas II, the output wiring areas III, and the output pad areas II may be sequentially disposed to be adjacent to the first edge 21 of the semiconductor chip 20 from a central area toward an outer area, and thus the input pads 210, the output pads 230, the second output wirings 132, and the output pads 230 may be sequentially disposed to be adjacent to the first edge 21 of the semiconductor chip 20 from the central area toward the outer area.

The second output wirings 132 included in each output wiring area III may be disposed adjacent to one another. One or more of the second output wirings 132 included in each output wiring area III may extend in the same direction and then extend in a first direction to be connected to some of the second output pads 232, respectively. One or more of the second output wirings 132 included in each output wiring area III may extend in the same direction (similarly to the above-described first portions 141), and may extend in a second direction opposite to the first direction to be connected to others of the second output pads 232. That is, all of the second output wirings 132 connected to the output pad areas II disposed on the left of the output wiring areas III are bent in a left direction to be connected to the second output pads 232, respectively. All of the second output wirings 132 connected to the output pad areas II can be disposed on the right of the output wiring areas III are bent in a right direction to be connected to the second output pads 232, respectively.

Figure 15:
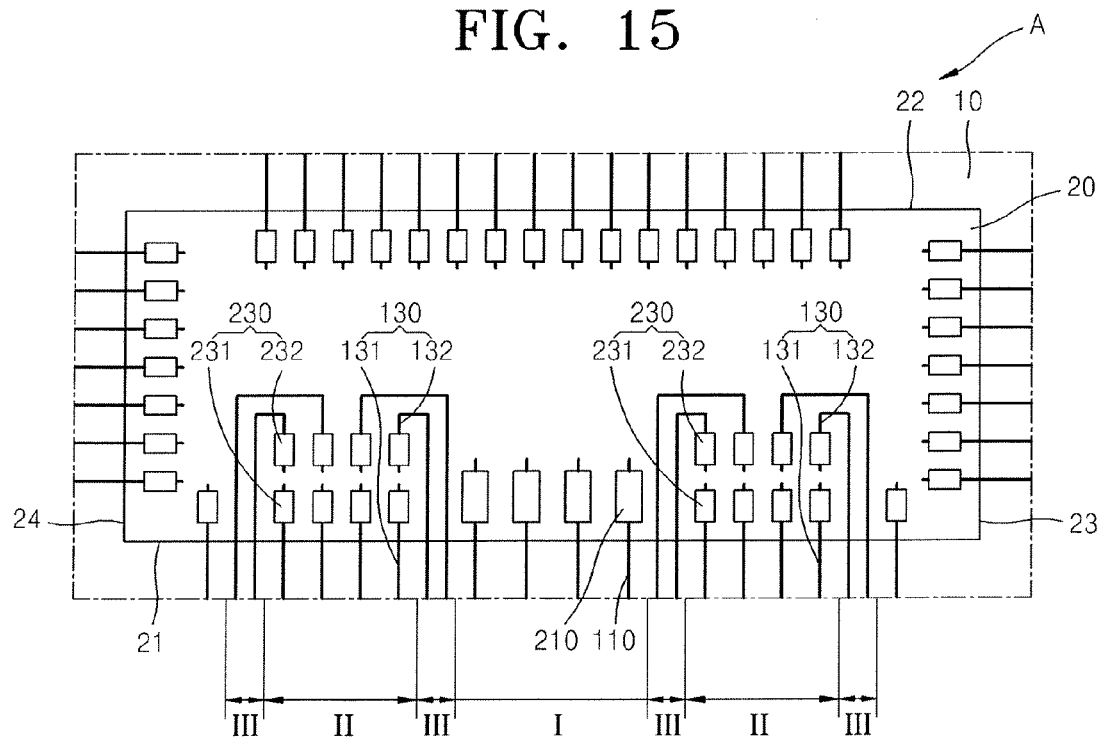

Referring to FIG. 15, the input pad area I including the input pads 210 may be disposed in a central area to be adjacent to the first edge 21 of the semiconductor chip 20 and may be disposed between the output wiring areas III including the second output wirings 132. In the input pad area I, the input pads 210 may be disposed adjacent to one another. In the output pad areas II, the output pads 230 may be disposed adjacent to one another. In the output wiring areas III, the second output wirings 132 may be disposed adjacent to one another. The input pad area I and the output wiring areas III may be adjacent to each other. The output pad areas II and the output wiring areas III may be adjacent to each other. The input pad area I and the output pad areas II may be spaced apart from each other by interposing the output wiring areas III. The output pad areas II may be disposed between the output wiring areas III. The input pads 210 disposed in outermost regions in the input pad area I may be adjacent to the second output wirings 132 disposed in outermost regions in the output wiring area III. The output pads 230 disposed in outermost regions in the output pad areas II may be adjacent to the second output wirings 132 disposed in outermost regions in the output wiring areas III. In other words, the input pad area I, the output wiring areas III, the output pad areas II, and the output wiring areas III may be sequentially disposed to be adjacent to the first edge 21 of the semiconductor chip 20 from a central area toward an outer area, and thus the input pads 210, the second output wirings 132, the output pads 230, and the second output wirings 132 may be sequentially disposed to be adjacent to the first edge 21 of the semiconductor chip 20 from the central area toward the outer area.

The second output wirings 132 included in each output wiring area III may be disposed adjacent to one another. All of the second output wirings 132 included in each output wiring area III may extend in the same direction to be connected to the second output pads 232, respectively. The second output wirings 132 included in each of the output wiring areas III disposed by interposing the output pad areas II extend in opposite directions to be connected to the second output pads 232, respectively. In other words, all of the second output wirings 132 included in the output wiring areas III disposed on the left of the output pad areas II are bent in a right direction to be connected to the second output pads 232, respectively. All of the second output wirings 132 included in the output wiring areas III disposed on the right of the output pad area II are bent in a left direction to be connected to the second output pads 232, respectively.

Figure 16:
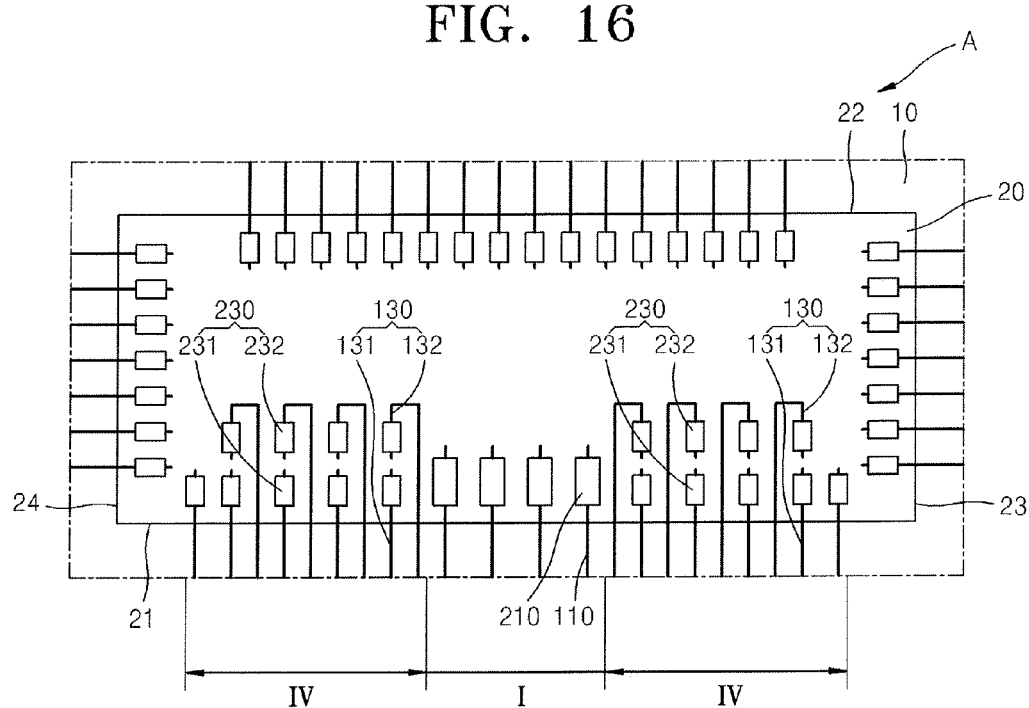

Referring to FIG. 16, the input pad area I including the input pads 210 may be disposed in a central area to be adjacent to the first edge 21 of the semiconductor chip 20 and may be disposed between mixed areas IV including both the output pads 230 and the second output wirings 132. In the input pad area I, the input pads 210 may be disposed adjacent to one another. In the mixed areas IV, the output pads 230 and the second output wirings 132 may be alternatively disposed. In other words, the second output wirings 132 may be disposed adjacent to the output pads 230, respectively. In particular, the output pads 230 may be disposed adjacent to the second output wirings 132 connected thereto, respectively. Positions of the second output wirings 132 respectively connected to the output pads 230 illustrated in FIG. 16 are just examples, and the present general inventive concept is not limited thereto. In other words, the second output wirings 132 respectively connected to the output pads 230 and disposed on the left of the output pads 230 may be disposed on the right in the A area of the tape package 1 of FIG. 1. The second output wirings 132 respectively connected to the output pads 230 and disposed on the right of the output pads 230 may be disposed on the left in the A area of the tape package 1 of FIG. 1.

All of the second output wirings 132 included in each mixed area IV may extend in the same direction to be connected to the second output pads 232, respectively. That is, all of the second output wirings 132 included in the mixed area IV disposed on the left of the input pad area I are bent in a left direction to be connected to the second output pads 232, respectively. All of the second output wirings 132 included in the mixed area IV disposed on the right of the input pad area I are bent in a right direction to be connected to the second output pads 232, respectively.

Although not illustrated in FIG. 16, the present general inventive concept may include where all of the second output wirings 132 included in the mixed area IV disposed on the left of the input pad area I are bent in a right direction to be connected to the second output pads 232, respectively. Although not illustrated in FIG. 16, the inventive concept also includes a case where all of the second output wirings 132 included in the mixed area IV disposed on the right of the input pad area I are bent in a left direction to be connected to the second output pads 232, respectively.

Figure 17:
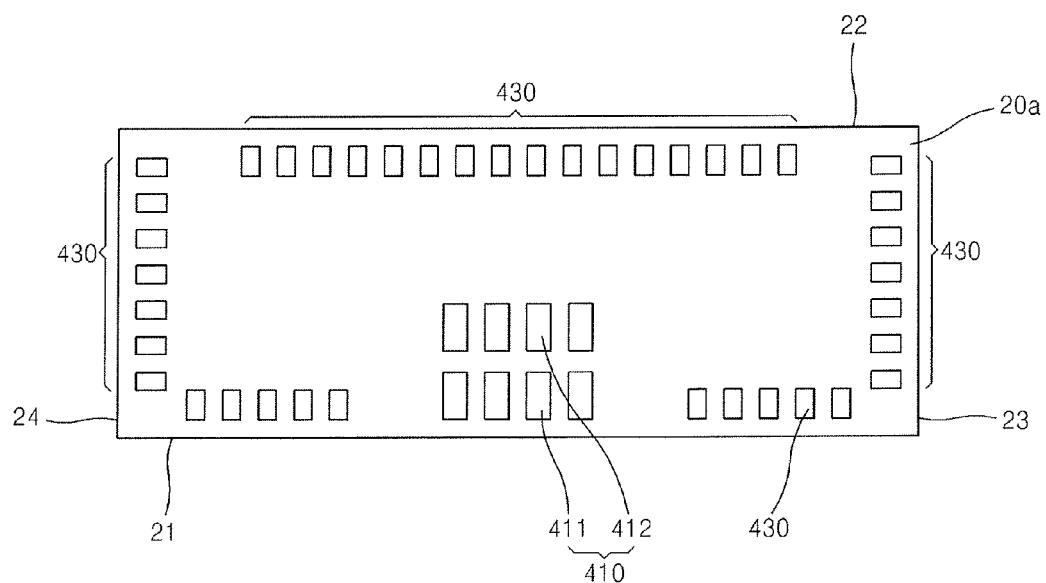
FIG. 17 is a rear view illustrating a semiconductor chip included in the tape package of FIG. 1, according to exemplary embodiments of the present general inventive concept.

FIG. 17 is a rear view illustrating a semiconductor chip 20a included in the tape package 1 of FIG. 1, according to exemplary embodiments of the present general inventive concept. The descriptions with regard to the semiconductor chip 20 described with reference to FIG. 2 will not be repeated here.

Referring to FIG. 17, the semiconductor chip 20a may include input pads 410 and output pads 430 on a rear surface thereof. In the exemplary embodiment of the present general inventive concept illustrated in FIG. 17, the input pads 410 and the output pads 430 may disposed adjacent to the first edge 21, and only the output pads 430 may be disposed adjacent to the second edge 22, the third edge 23, and the fourth edge 24. The input pads 410 may be disposed in a central area between the output pads 430. The input pads 410 disposed adjacent to the first edge 21 may be arranged in a plurality of rows, for example, in two or more rows. The input pads 410 may include a plurality of first input pads 411 arranged in a third row to be adjacent to the first edge 21 and a plurality of second input pads 412 arranged in a fourth row to be farther spaced apart from the first edge 21 than the first input pads 411. The second input pads 412 may be arranged collinearly with respect to the first input pads 411 in a vertical direction with respect to the first edge 21. That is, the first input pads 411 and second input pads 412 may be arranged along the same axes so as to form columns of input pads. However, the arrangement of the input pads 410 is just an example, and the present general inventive concept is not limited thereto. The arrangements of the input pads 410 and the output pads 430 are just examples, and the present general inventive concept is not limited thereto.

FIGS. 18 through 21 are enlarged plane views illustrating the A area of the tape package 1 of FIG. 1, according to exemplary embodiments of the present general inventive concept. The semiconductor chip 20a illustrated in FIGS. 18 through 21 corresponds to the semiconductor chip 20a described with reference to FIG. 17.

The exemplary embodiments of FIGS. 18 through 21 illustrate cases where technological characteristics described with regard to the output wirings 130 and the output pads 230 are applied to input wirings 310 and the input pads 410. The exemplary embodiment of FIG. 18 may refer to the descriptions with regard to the exemplary embodiments of FIGS. 3 and 13. The exemplary embodiment of FIG. 19 may refer to the descriptions with regard to the embodiment of FIG. 14. The exemplary embodiment of FIG. 20 may refer to the descriptions with regard to the embodiment of FIG. 15. The exemplary embodiment of FIG. 21 may refer to the descriptions with regard to the embodiment of FIG. 16. In the exemplary embodiments as described herein, the input wirings 310 and output wirings 330 may correspond to the input wirings 110 and the output wirings 130 of FIG. 1.

Figure 18:
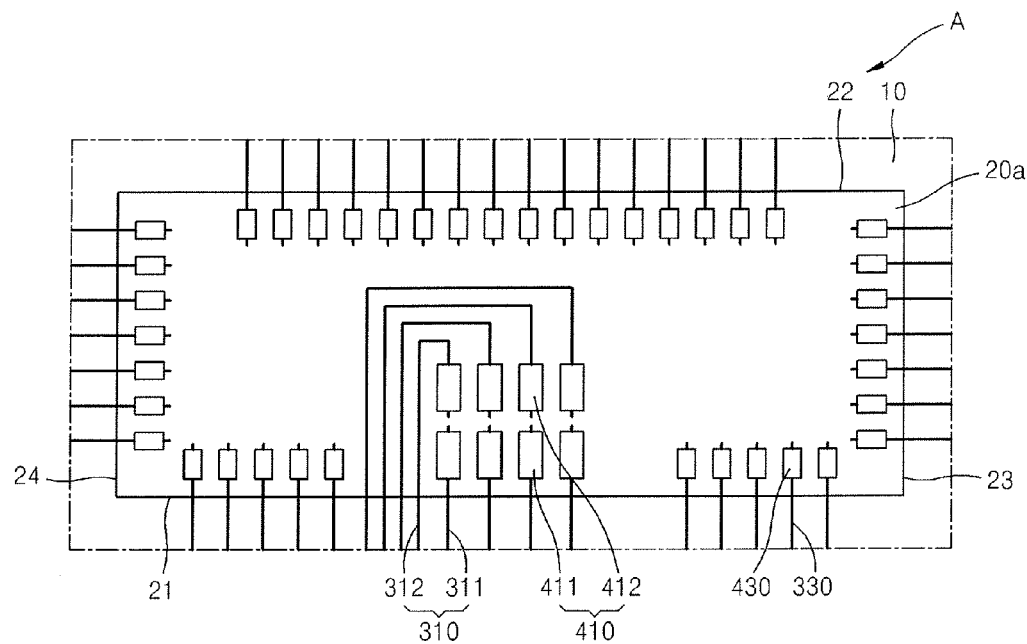
FIGS. 18 through 21 are enlarged plane views illustrating the A area of the tape package of FIG. 1, according to exemplary embodiments of the present general inventive concept.

Referring to FIG. 18, the input pads 410 and the output pads 430 may be disposed adjacent to the first edge 21 of the semiconductor chip 20a mounted on the tape wiring substrate 10. The input wirings 310 respectively connected to the input pads 410 and the output wirings 330 respectively connected to the output pads 430 may be disposed adjacent to the first edge 21 of the semiconductor chip 20a mounted on the tape wiring substrate 10. The input pads 410 may include the first input pads 411 and the second input pads 412. The output pads 430 may be disposed in a row adjacent along each of the second edge 22, the third edge 23, and the fourth edge 24 of the semiconductor chip 20a, and the input pads 410 may not be disposed adjacent thereto.

The output pads 430 may be arranged in a single row, and the input pads 410 may be arranged in a plurality of rows, for example, in two rows. That is, the input pads 410 may include the first input pads 411 arranged in a third row to be adjacent to the first edge 21 of the semiconductor chip 20a and the second input pads 412 arranged in a fourth row to be farther spaced apart from the first edge 21 than the first input pads 411. That is, first input pads 411 and second input pads 412 may be disposed along axes that are parallel to one another (e.g., where a first input pad and a second input pad are spaced apart from one another along the same axis), so as to form columns of input pads. Some of the input pads 410 may be adjacent to one another. For example, some of the first input pads 411 may be adjacent to one another and some of the second input pads 412 may be adjacent to one another.

First sides of the output wirings 330 may extend toward portions of the output pads 430 close to the first edge 21 to be respectively connected to the output pads 430. Second sides of the output wirings 330 may extend out of the semiconductor chip 20a.

First sides of the first input wirings 311 may extend toward portions of the first input pads 411 close to the first edge 21 to be respectively connected to the first input pads 411. Second sides of the first input wirings 311 may extend out of the semiconductor chip 20a.

First sides of the second input wirings 312 may extend toward portions of the second input pads 412 spaced from (e.g., spaced relatively far from) the first edge 21 to be respectively connected to the second input pads 412. Second sides of the second input wirings 312 may extend out of the semiconductor chip 20a. The second input wirings 312 may be bent lines (e.g., bent lines having predetermined angles or predetermined curved portions). The second input wirings 312 may include technological characteristics of the second output wirings 132 described with reference to FIGS. 4 through 9.

FIG. 18 illustrates a relative position relationship between the input pads 410, the output pads 430, and the second input wirings 312. The relative position relationship may refer to the exemplary embodiment described with reference to FIG. 3. The input pads 410 may be disposed in a central area to be adjacent to the first edge 21 of the semiconductor chip 20a, and may be disposed between the output pads 430. The output pads 430 may be adjacent to one another. The input pads 410 may be adjacent to one another. All of the second input wirings 312 may be disposed on the left of the input pads 410. The input pads 410, the second input wirings 312, and the output pads 430 may be sequentially disposed to be adjacent to the first edge 21 of the semiconductor chip 20a from a central area toward an outer area in a left direction. The input pads 410 and the output pads 430 may be sequentially disposed in a right direction. The present general inventive concept may include where the second input wirings 312 are disposed on the right of the input pads 410.

The second input wirings 312 may be adjacent to one another. The second input wirings 312 may extend in the same direction to be connected to the second input pads 412, respectively. All of the second input wirings 312 disposed on the left of the second input pads 412 are bent in a right direction to be connected to the second input pads 412, respectively. Although not illustrated in FIG. 18, the second input wirings 312 may be disposed on the right of the second input pads 412 and all of the second input wirings 312 disposed on the right of the second input pads 412 are bent in a left direction to be connected to the second input pads 412, respectively.

Figure 19:
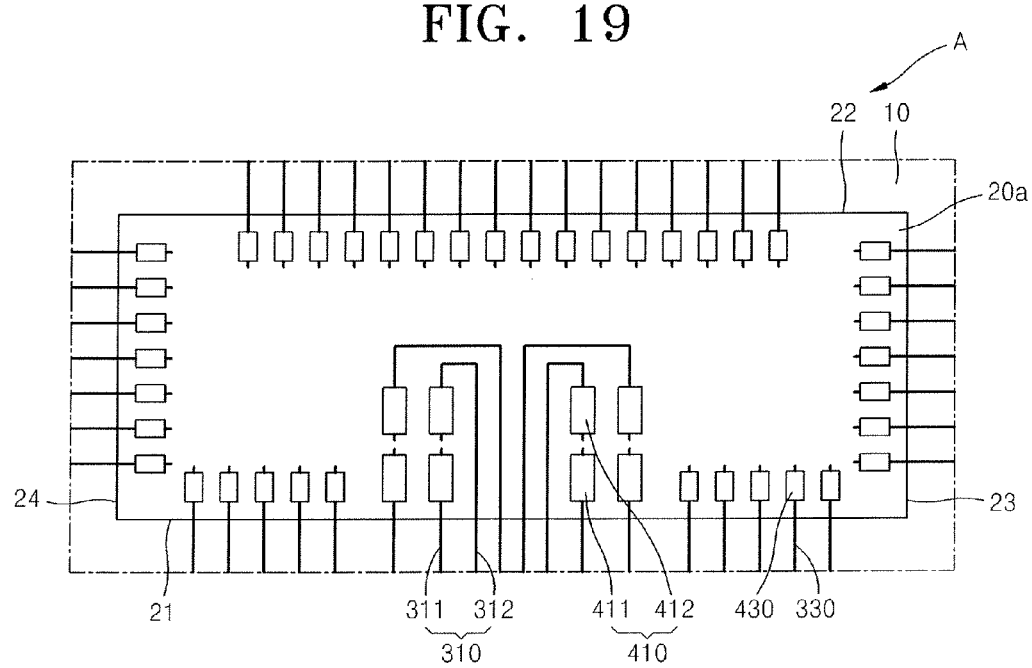

FIG. 19 illustrates a relative position relationship between the input pads 410, the output pads 430, and the second input wirings 312. The relative position relationship may refer to the exemplary embodiment described with reference to FIG. 14. The input pads 410 may be disposed in a central area to be adjacent to the first edge 21 of the semiconductor chip 20a, and may be disposed between the output pads 430. The output pads 430 may be adjacent to one another. One or more of the input pads 410 may be adjacent to one another. The second input wirings 312 may be adjacent to one another. All of the second input wirings 312 may be disposed between the input pads 410. The second input wirings 312, the input pads 410, and the output pads 430 may be sequentially disposed to be adjacent to the first edge 21 of the semiconductor chip 20a from a central area toward an outer area.

One or more of the second input wirings 312 may extend in the same direction and then extend in a first direction to be connected to some of the second input pads 412, respectively. One or more of the second input wirings 312 may extend in the same direction (similarly to the above-described first portions 141) and extend in a second direction opposite to the first direction to be connected to one or more of the second input pads 412, respectively. That is, all of the second input wirings 312 connected to the second input pads 412 disposed on the left of the second input wirings 312 can be bent in a left direction to be connected to the second input pads 412, respectively. All of the second input wirings 312 connected to the second input pads 412 disposed on the right of the second input wirings 312 can be bent in a right direction to be connected to the second input pads 412, respectively.

Figure 20:
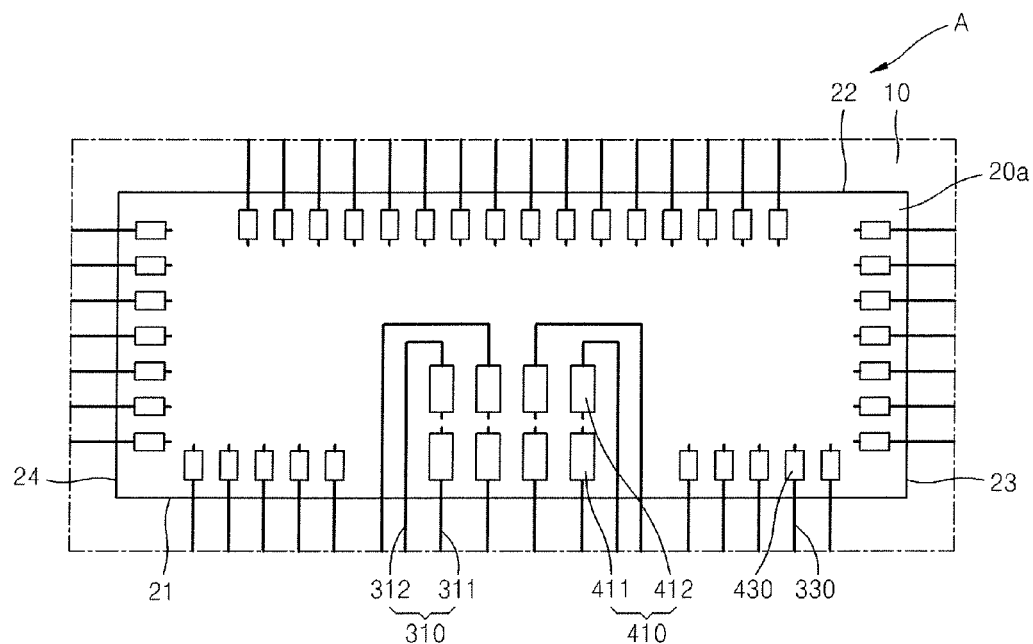

FIG. 20 illustrates a relative position relationship between the input pads 410, the output pads 430, and the second input wirings 312. The relative position relationship may refer to the exemplary embodiment described with reference to FIG. 15. The input pads 410 may be disposed in a central area to be adjacent to the first edge 21 of the semiconductor chip 20a, and may be disposed between the output pads 430. The output pads 430 may be adjacent to one another. The input pads 410 may be adjacent to one another. One or more of the second input wirings 312 may be adjacent to one another. All of the input pads 410 may be disposed between the second input wirings 312. The input pads 410, the second input wirings 312, and the output pads 430 may be sequentially disposed to be adjacent to the first edge 21 of the semiconductor chip 20a from a central area toward an outer area.

One or more of the second input wirings 312 may extend in the same direction and then extend in a first direction to be connected to some of the second input pads 412, respectively. One or more of the second input wirings 312 may extend in the same direction (similarly to the above-described first portion 141), and extend in a second direction opposite to the first direction to be connected to others of the second input pads 412, respectively. That is, all of the second input wirings 312 disposed on the left of the second input pads 412 can be bent in a right direction to be connected to the second input pads 412, respectively. All of the second input wirings 312 disposed on the right of the second input pads 412 can be bent in a left direction to be connected to the second input pads 412, respectively.

Figure 21:
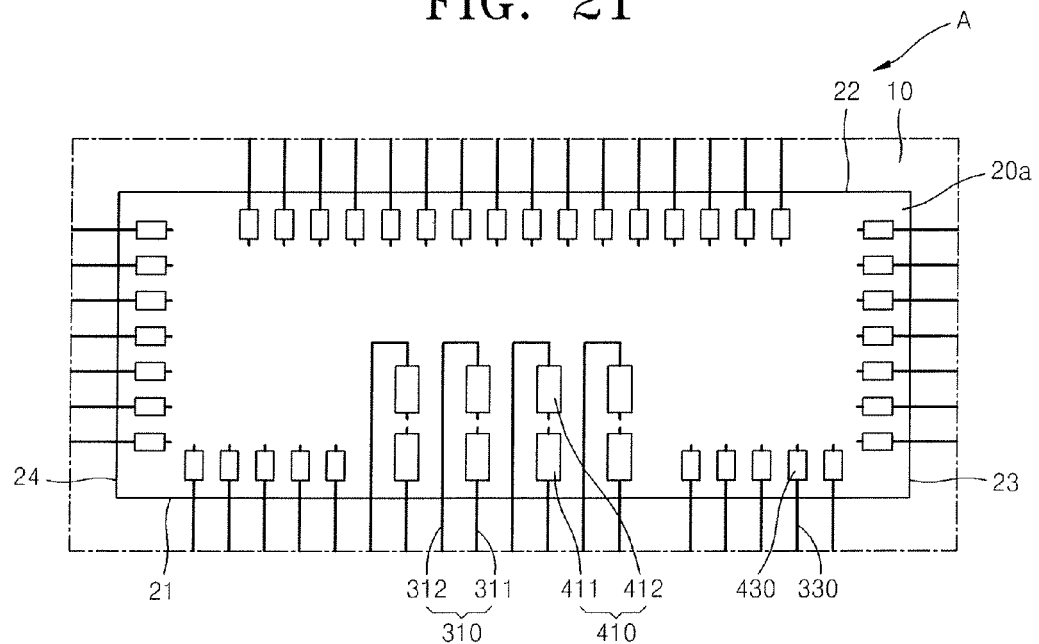

FIG. 21 illustrates a relative position relationship between the input pads 410, the output pads 430, and the second input wirings 312. The relative position relationship may refer to the exemplary embodiment described with reference to FIG. 16. The input pads 410 may be disposed in a central area to be adjacent to the first edge 21 of the semiconductor chip 20a, and may be disposed between the output pads 430. The output pads 430 may be adjacent to one another. The input pads 410 and the second input wirings 312 may be alternatively disposed. That is, the second input wirings 312 may be disposed adjacent to the input pads 410, respectively. In particular, the input pads 410 may be respectively disposed adjacent to the second input wirings 312 connected thereto. In FIG. 21, the second input wirings 312 connected to the input pads 410 are disposed on the left in the A area, but the present general inventive concept is not limited thereto. That is, the inventive concept may include a case where the second input wirings 312 connected to the input pads 410 are disposed on the right in the A area.

All of the second input wirings 312 may extend in the same direction to be connected to the second input pads 412, respectively. That is, all of the second input wirings 312 are bent in a right direction to be connected to the second input pads 412, respectively. Although not illustrated in FIG. 21, the inventive concept may include where all of the second input wirings 312 are bent in a left direction to be connected to the second input pads 412, respectively.

Figure 22:
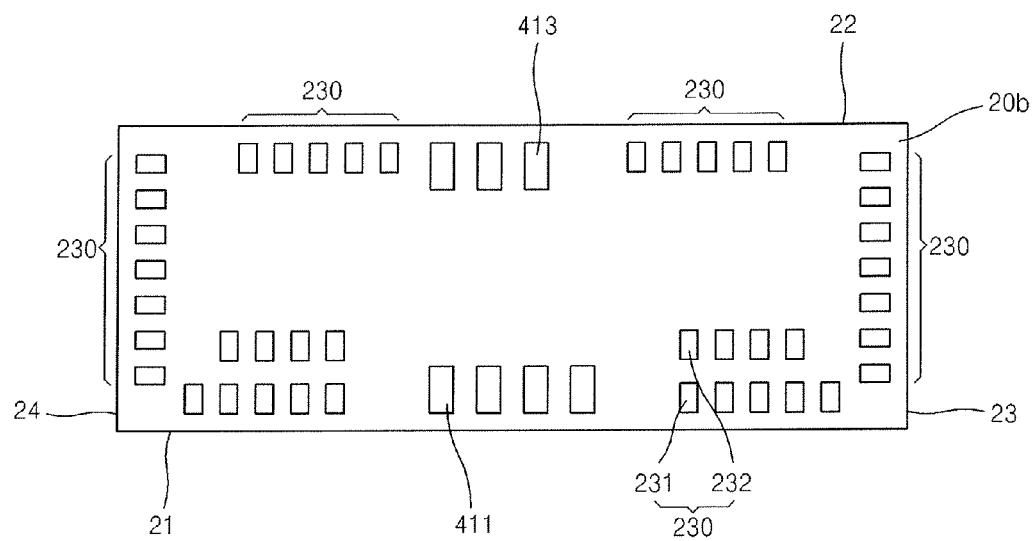
FIG. 22 is a rear view illustrating a semiconductor chip included in the tape package of FIG. 1, according to exemplary embodiments of the present general inventive concept.

FIG. 22 is a rear view illustrating a semiconductor chip 20b included in the tape package 1 of FIG. 1, according to exemplary embodiments of the present inventive concept.

Referring to FIG. 22 22, the semiconductor chip 20b may include the first input pads 411, third input pads 413, and the output pads 230 on a rear surface thereof. As described above with reference to FIG. 2, the output pads 230 may include the first output pads 231 arranged in a first row to be adjacent to the first edge 21 of the semiconductor chip 20b and the second output pads 232 arranged in a second row to be farther spaced apart from the first edge 21 than the first output pads 231. The output pads 230 have already been described above, and thus the descriptions thereof will not be repeated here.

In the exemplary embodiment illustrated in FIG. 22, the first input pads 411 and the output pads 230 may be disposed adjacent to the first edge 21, and the third input pads 413 and the output pads 230 may be disposed adjacent to the second edge 22. In exemplary embodiments of the present general inventive concept, only the output pads 230 may be disposed adjacent to the third edge 23 and the fourth edge 24. The first input pads 411 may be disposed in a central area to be adjacent to the first edge 21, and may be disposed between the output pads 230. The third input pads 413 may be disposed in a central area to be adjacent to the second edge 22, and may be disposed between the output pads 230. The positions of the third input pads 413 are just an example, and the present general inventive concept is not limited thereto.

Figure 23:
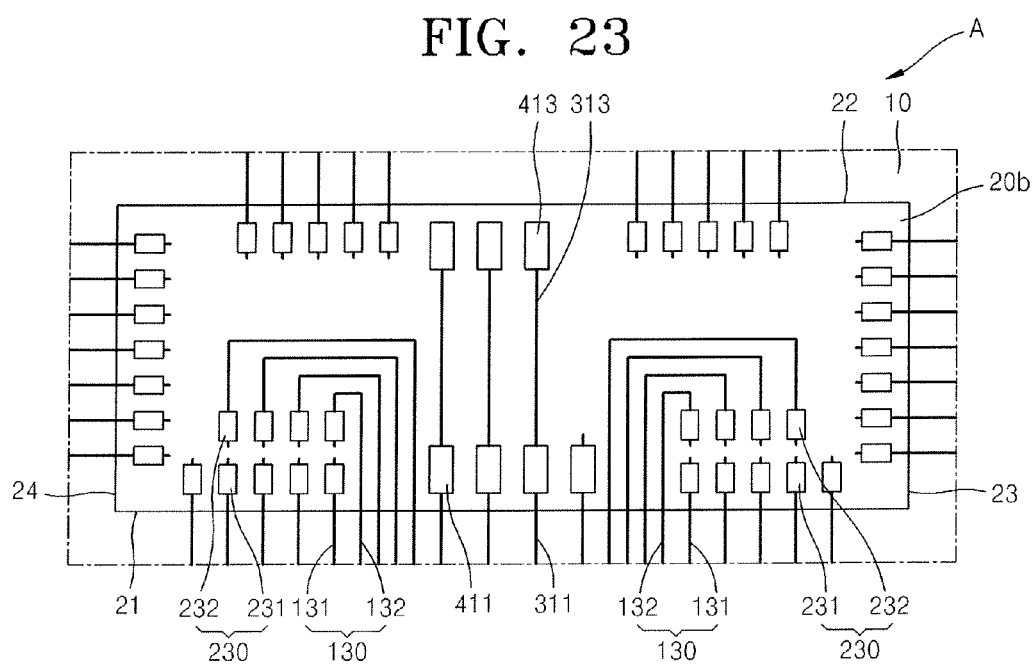
FIG. 23 is an enlarged plane view illustrating the A area of the tape package of FIG. 1, according to exemplary embodiments of the present general inventive concept.

FIG. 23 is an enlarged plane view illustrating the A area of the tape package 1 of FIG. 1, according to exemplary embodiments of the present general inventive concept. The semiconductor chip 20b illustrated in FIG. 23 corresponds to the semiconductor chip 20b described with reference to FIG. 22.

The present general inventive concept may include cases where the exemplary embodiment illustrated in FIG. 23 is combined with the above-described embodiments. That is, the present general inventive concept may include cases where various arrangements of the output wirings 130 including the first output wirings 131 and the second output wirings 132 and of the output pads 230 including the first output pads 231 and the second output pads 232 are applied to the present exemplary embodiment illustrated in FIG. 23.

Referring to FIG. 23, the first input pads 411 and the output pads 230 may be disposed adjacent to the first edge 21 of the semiconductor chip 20b mounted on the tape wiring substrate 10. The first input wirings 311 respectively connected to the first input pads 411 and the output wirings 130 respectively connected to the output pads 230 may be disposed adjacent to the first edge 21 of the semiconductor chip 20b.

The third input pads 413 may be disposed adjacent to the second edge 22 of the semiconductor chip 20b mounted on the tape wiring substrate 10. The third input pads 413 may be respectively connected to the first input pads 411 via third input wirings 313. One or more of the first input pads 411 may be respectively connected to the third input pads 413, and one or more of the first input pads 411 may not be connected to the third input pads 413. Accordingly, the first input pads 411 and the third input pads 413 may be respectively connected to the first input wirings 311 and the third input wirings 313 at portions close to the first edge 21.

Figure 24:
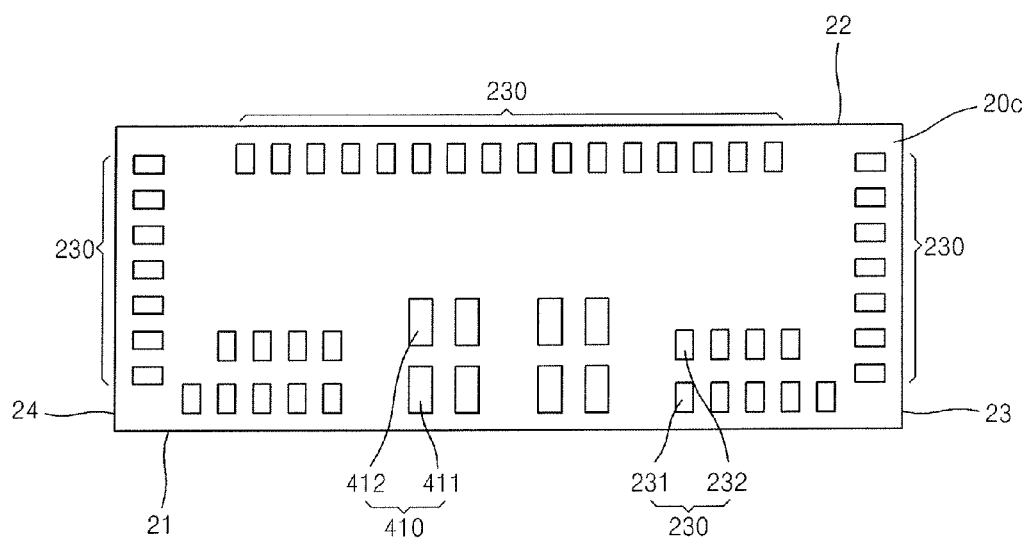
FIG. 24 is a rear view illustrating a semiconductor chip included in the tape package of FIG. 1, according to exemplary embodiments of the present general inventive concept.

FIG. 24 is a rear view illustrating a semiconductor chip 20c included in the tape package 1 of FIG. 1, according to exemplary embodiments of the present general inventive concept.

Referring to FIG. 24, the semiconductor chip 20c may include the input pads 410 and the output pads 230 on a rear surface thereof to be adjacent to the first edge 21. The semiconductor chip 20c illustrated in FIG. 24 corresponds to a case where the exemplary embodiment illustrated in FIG. 2 and the exemplary embodiment illustrated in FIG. 17 are combined together. As illustrated in the exemplary embodiment of FIG. 2, the output pads 230 may be arranged in a plurality of rows, for example, in two or more rows. The output pads 230 may include the first output pads 231 arranged in a first row to be adjacent to the first edge 21 and the second output pads 232 arranged in a second row to be farther spaced apart from the first edge 21 than the first output pads 231. As illustrated in the exemplary embodiment of FIG. 17, the input pads 410 may be arranged in a plurality of rows, for example, in two or more rows. The input pads 410 may include the first input pads 411 arranged in a third row to be adjacent to the first edge 21 and the second input pads 412 arranged in a fourth row to be farther spaced apart from the first edge 21 than the first input pads 411. The first output pads 231 and the second output pads 232 may be arranged along axes that are parallel to one another so as to form columns of output pads 230, where the second output pads 232 are spaced farther from the first edge 21 than the first output pads 231. The first input pads 411 and the second input pads 412 may be arranged along axes that are parallel to one another so as to form columns of input pads 410, where the second input pads 412 are spaced farther from the first edge 21 than the first input pads 411.

Figure 25:
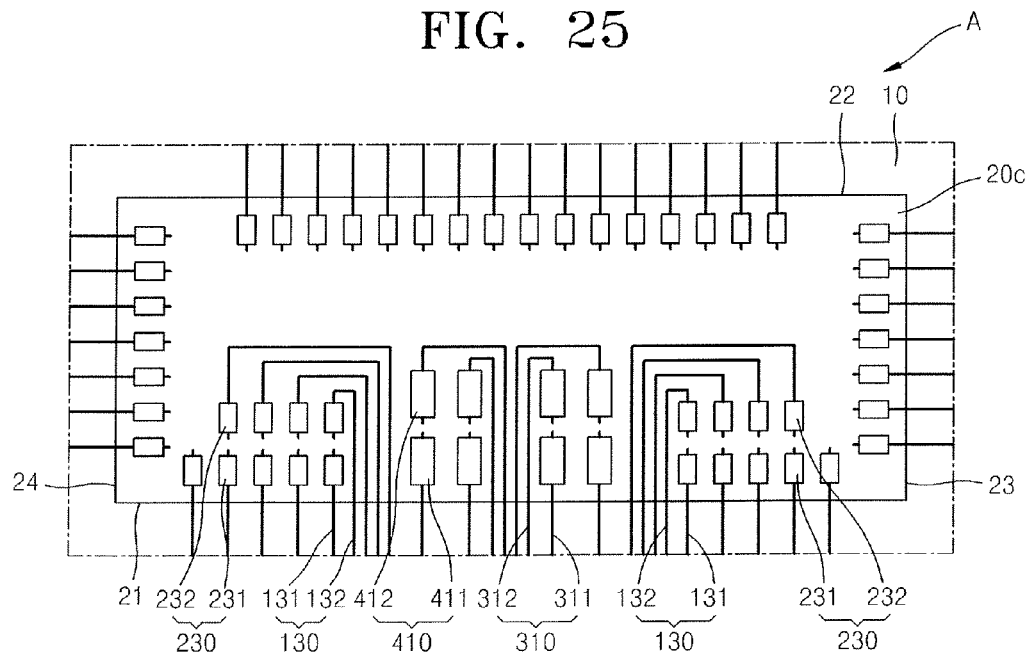
FIG. 25 is an enlarged plane view illustrating the A area of the tape package of FIG. 1, according to exemplary embodiments of the present general inventive concept.

FIG. 25 is an enlarged plane view illustrating the A area of the tape package 1 of FIG. 1, according to exemplary embodiments of the inventive concept. The semiconductor chip 20c illustrated in FIG. 25 corresponds to the semiconductor chip 20c described with reference to FIG. 24. The present general inventive concept may include cases where the exemplary embodiment illustrated in FIG. 25 is combined with the above-described embodiments.

Referring to FIG. 25, the output pads 230 and the input pads 410 may be disposed adjacent to the first edge 21 of the semiconductor chip 20c mounted on the tape wiring substrate 10. The output pads 230 may include the first output pads 231 arranged in a first row to be adjacent to the first edge 21 and the second output pads 232 arranged in a second row to be farther spaced apart from the first edge 21 than the first output pads 231. The input pads 410 may include the first input pads 411 arranged in a third row to be adjacent to the first edge 21 and the second input pads 412 arranged in a fourth row to be farther spaced apart from the first edge 21 than the first input pads 411.

The output wirings 130 may include the first output wirings 131 and the second output wirings 132. The first output wirings 131 may extend toward portions of the first output pads 231 that are close to the first edge 21 to be respectively connected to the first output pads 231. The second output wirings 132 may extend toward portions of the second output pads 232 that are farther from the first edge 21 than the first output pads 231 to be respectively connected to the second output pads 232.

The input wirings 310 may include the first input wirings 311 and the second input wirings 312. The first input wirings 311 may extend toward portions of the first input pads 411 that are close to the first edge 21 to be respectively connected to the first input pads 411. The second input wirings 312 may extend toward portions of the second input pads 412 that are farther from the first edge 21 than the first input pads 411 to be respectively connected to the second input pads 412.

Figure 26:
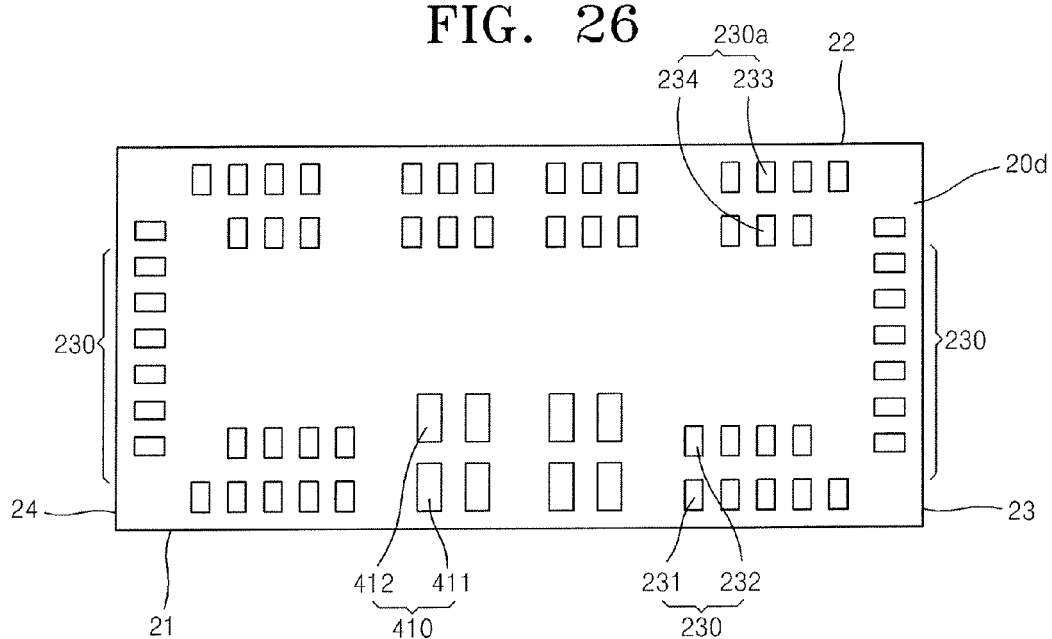
FIG. 26 is a rear view illustrating a semiconductor chip included in the tape package of FIG. 1, according to exemplary embodiments of the present general inventive concept.

FIG. 26 is a rear view illustrating a semiconductor chip 20d included in the tape package 1 of FIG. 1, according to exemplary embodiments of the present general inventive concept.

Referring to FIG. 26, the semiconductor chip 20d may include the input pads 410 and the output pads 230 on a rear surface thereof to be adjacent to the first edge 21. The semiconductor chip 20d illustrated in FIG. 26 corresponds to a case where the exemplary embodiment illustrated in FIG. 2 and the exemplary embodiment illustrated in FIG. 17 are combined together. As illustrated in the exemplary embodiment of FIG. 2, the output pads 230 may be arranged in a plurality of rows, for example, in two or more rows. The output pads 230 may include the first output pads 231 arranged to be adjacent to the first edge 21 and the second output pads 232 arranged to be farther spaced apart from the first edge 21 than the first output pads 231. As illustrated in the exemplary embodiment of FIG. 17, the input pads 410 may be arranged in a plurality of rows, for example, in two or more rows. The input pads 410 may include the first input pads 411 arranged to be adjacent to the first edge 21 and the second input pads 412 arranged to be farther spaced apart from the first edge 21 than the first input pads 411. The first input pads 411 and the second input pads 412 may be arranged on axes that are parallel to one another so as to form columns of input pads 410.

The semiconductor chip 20d may further include output pads 230a disposed adjacent to the second edge 22 on the rear surface thereof. The output pads 230a may be arranged in a plurality of rows, for example, in two or more rows. The output pads 230a may include a plurality of third output pads 233 adjacent to the second edge 22 and a plurality of fourth output pads 234 that are farther spaced apart from the second edge 22 than the third output pads 233. The third output pads 233 and the fourth output pads 234 may be arranged on axes that are parallel to one another so as to form columns of output pads 230a.

Figure 27:
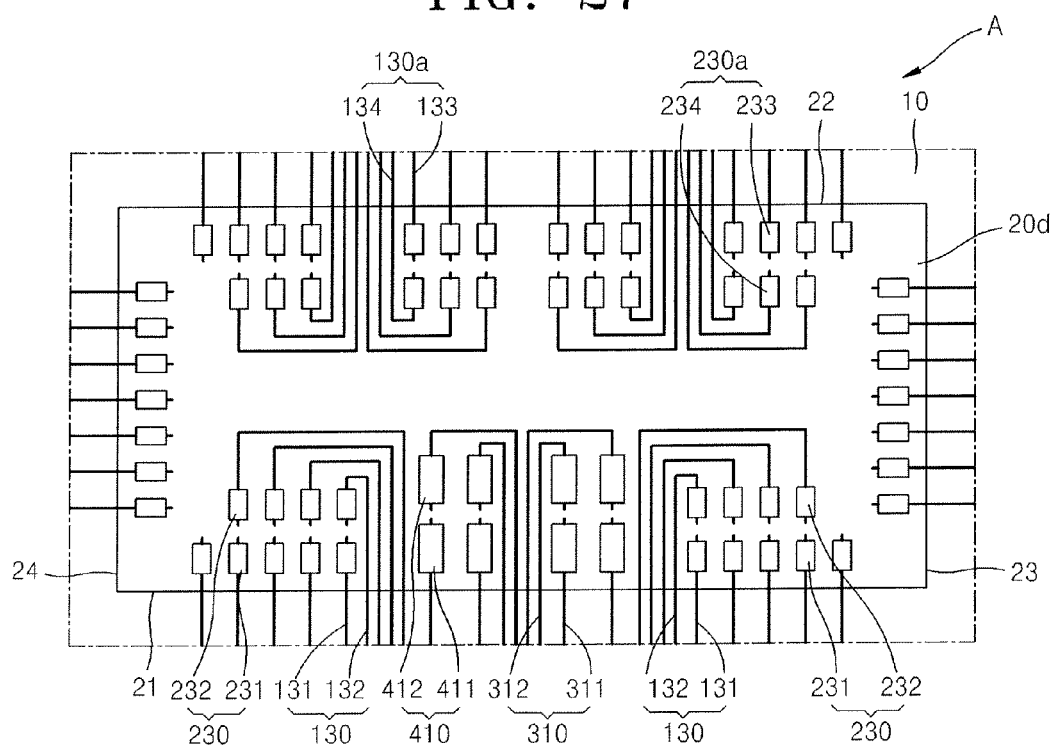
FIG. 27 is an enlarged plane view illustrating the A area of the tape package of FIG. 1, according to exemplary embodiments of the present general inventive concept.

FIG. 27 is an enlarged plane view illustrating the A area of the tape package 1 of FIG. 1, according to exemplary embodiments of the inventive concept. The semiconductor chip 20d illustrated in FIG. 27 corresponds to the semiconductor chip 20d described with reference to FIG. 26. The present general inventive concept may include cases where the exemplary embodiment illustrated in FIG. 27 is combined with the above-described embodiments.

Referring to FIG. 27, the output pads 230 and the input pads 410 may be disposed adjacent to the first edge 21 of the semiconductor chip 20d mounted on the tape wiring substrate 10. The output pads 230a may be disposed adjacent to the second edge 22 facing the first edge 21 of the semiconductor chip 20d. The output pads 230 disposed adjacent to the first edge 21 may include the first output pads 231 disposed adjacent to the first edge 21 and the second output pads 232 disposed to be farther spaced apart from the first edge 21 than the first output pads 231. The input pads 410 may include the first input pads 411 disposed adjacent to the first edge 21 and the second input pads 412 disposed to be farther spaced apart from the first edge 21 than the first input pads 411. The output pads 230a disposed adjacent to the second edge 22 may include the third output pads 233 disposed adjacent to the second edge 22 and the fourth output pads 234 disposed to be farther spaced apart from the second edge 22 than the third output pads 233.

The output wirings 130 disposed adjacent to the first edge 21 may include the first output wirings 131 and the second output wirings 132. The first output wirings 131 may extend toward portions of the first output pads 231 relatively close to the first edge 21 to be respectively connected to the first output pads 231. The second output wirings 132 may extend toward portions of the second output pads 232 relatively far from the first edge 21 to be respectively connected to the second output pads 232.

The input wirings 310 may include the first input wirings 311 and the second input wirings 312. The first input wirings 311 may extend toward portions of the first input pads 411 relatively close to the first edge 21 to be respectively connected to the first input pads 411. The second input wirings 312 may extend toward portions of the second input pads 412 relatively far from the first edge 21 to be respectively connected to the second input pads 412.

A plurality of output wirings 130a disposed adjacent to the second edge 22 may include third output wirings 133 and fourth output wirings 134. The third output wirings 133 may extend toward portions of the third output pads 233 relatively close to the second edge 22 to be respectively connected to the third output pads 233. The fourth output wirings 134 may extend toward portions of the fourth output pads 234 relatively far from the second edge 22 to be respectively connected to the fourth output pads 234.

Figure 28:
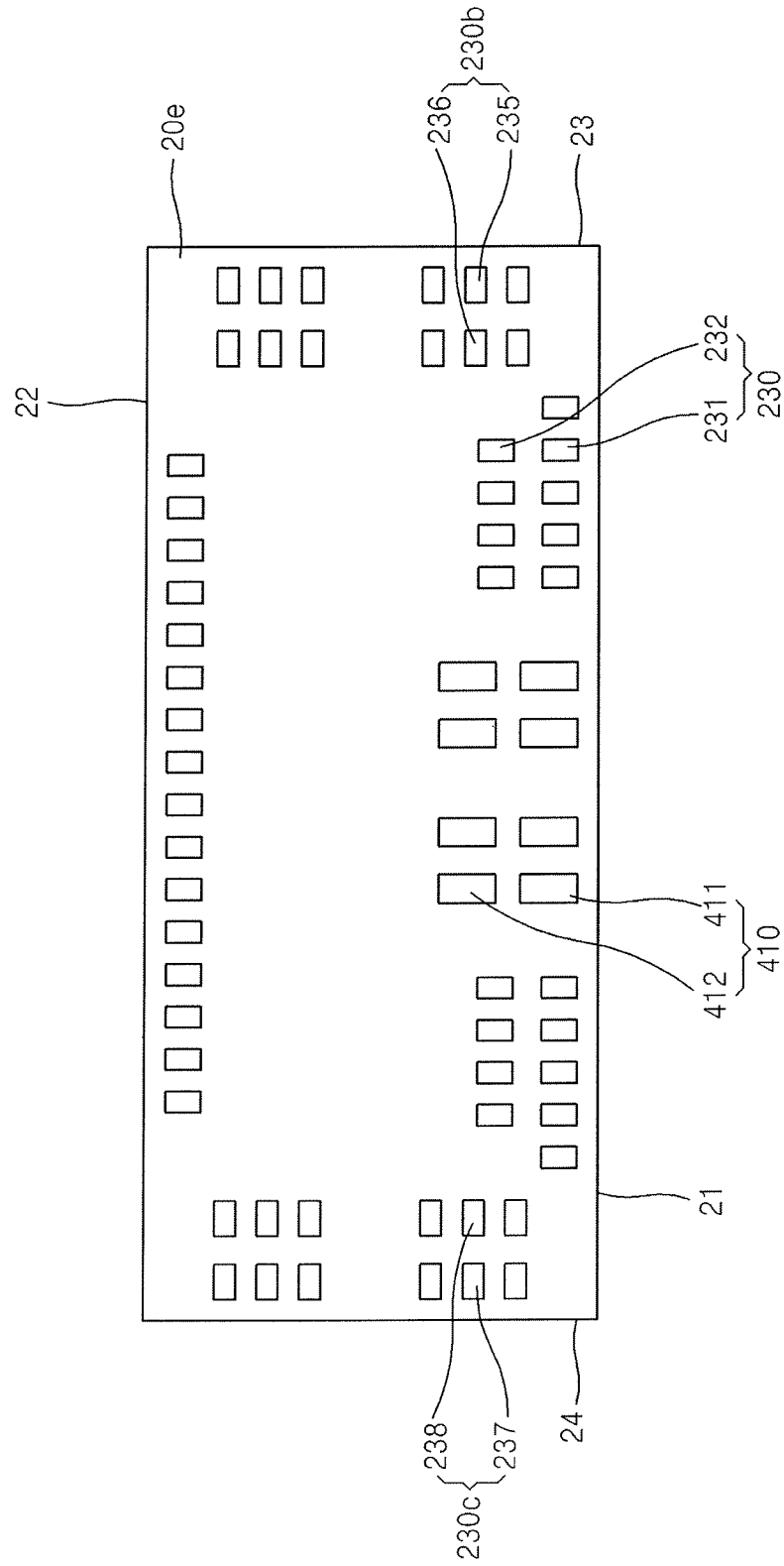
FIG. 28 is a rear view illustrating a semiconductor chip included in the tape package of FIG. 1, according to exemplary embodiments of the present general inventive concept.

FIG. 28 is a rear view illustrating a semiconductor chip 20e included in the tape package 1 of FIG. 1, according to exemplary embodiments of the inventive concept.

Referring to FIG. 28, the semiconductor chip 20e may include the input pads 410 and the output pads 230 on a rear surface thereof to be adjacent to the first edge 21. The semiconductor chip 20e illustrated in FIG. 28 corresponds to a case where the exemplary embodiment illustrated in FIG. 2 and the exemplary embodiment illustrated in FIG. 17 are combined together. As illustrated in the embodiment of FIG. 2, the output pads 230 may be arranged in a plurality of rows, for example, in two or more rows. The output pads 230 may include the first output pads 231 arranged adjacent to the first edge 21 and the second output pads 232 arranged to be farther spaced apart from the first edge 21 than the first output pads 231. The output pads 230 may be arranged along a plurality of axes that are parallel to one another, so that the first output pads 231 and the second input pads 232 form columns. As illustrated in the embodiment of FIG. 17, the input pads 410 may be arranged in a plurality of rows, for example, in two or more rows. The input pads 410 may include the first input pads 411 arranged adjacent to the first edge 21 and the second input pads 412 arranged to be farther spaced apart from the first edge 21 than the first input pads 411. The input pads 410 may be arranged along a plurality of axes that are parallel to one another, so that the first input pads 411 and the second input pads 412 form columns.

The semiconductor chip 20e may further include output pads 230b disposed adjacent to the third edge 23 on the rear surface thereof. The output pads 230b may be arranged in a plurality of rows, for example, in two or more rows. The output pads 230b may include a plurality of fifth output pads 235 that are adjacent to the third edge 23 and a plurality of sixth output pads 236 farther spaced apart from the third edge 23 than the fifth output pads 235. The output pads 230b may be arranged along a plurality of axes that are parallel to one another, so that the fifth output pads 235 and the sixth output pads 236 form columns.

The semiconductor chip 20e may further include output pads 230c disposed adjacent to the fourth edge 24 on the rear surface thereof. The output pads 230c may be arranged in a plurality of rows, for example, in two or more rows. The output pads 230c may include a plurality of seventh output pads 237 adjacent to the fourth edge 24 and a plurality of eighth output pads 238 farther spaced apart from the fourth edge 24 than the seventh output pads 237. The output pads 230c may be arranged along a plurality of axes that are parallel to one another, so that the seventh output pads 237 and the eighth output pads 238 form columns.

In this regard, the semiconductor chip 20e may include any one or all of the output pads 230b disposed adjacent to the third edge 23 and the output pads 230c disposed adjacent to the fourth edge 24. That is, the semiconductor chip 20e may include output pads arranged in a plurality of rows in at least one of the third edge 23 and the fourth edge 24.

Figure 29:
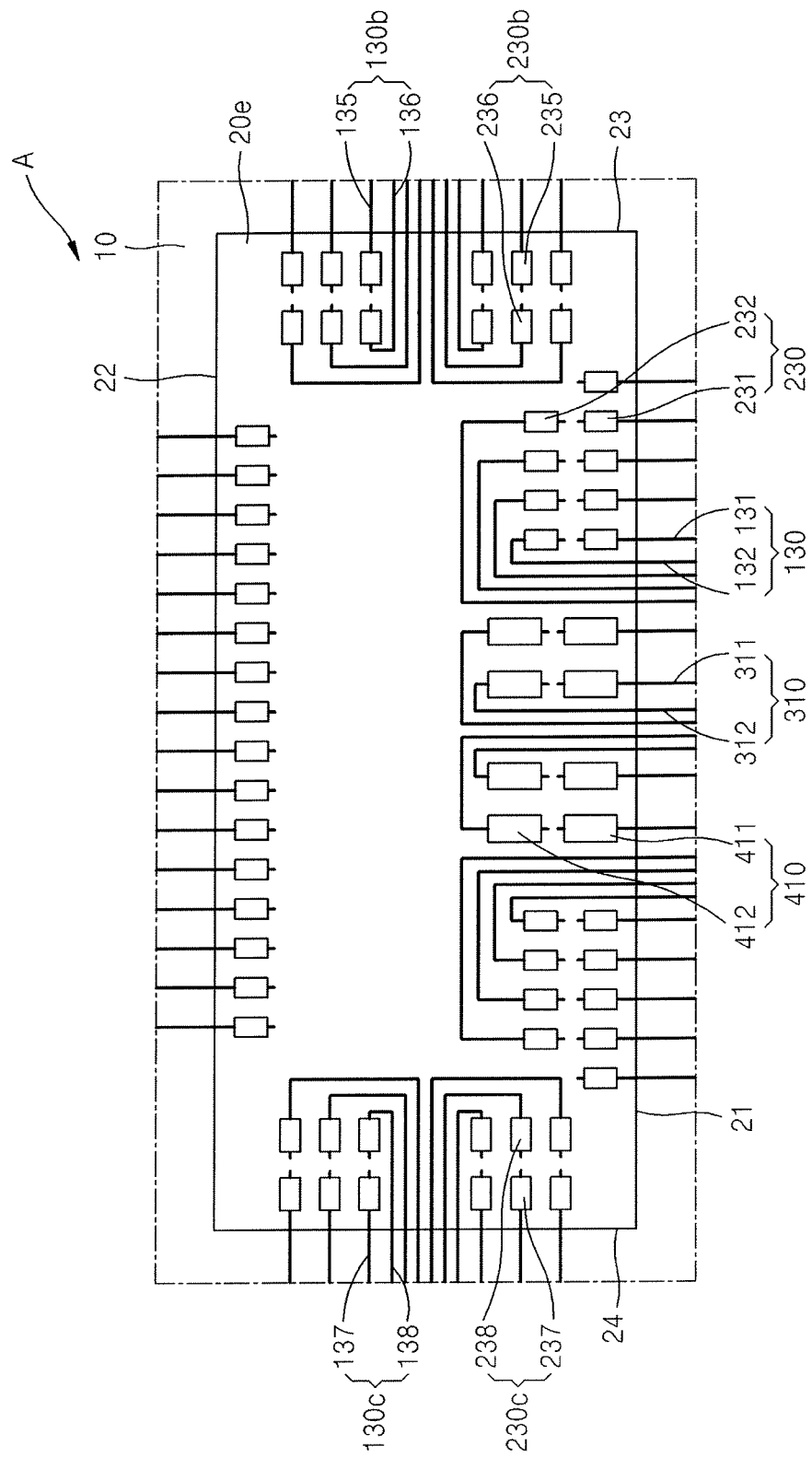
FIG. 29 is an enlarged plane view illustrating the A area of the tape package of FIG. 1, according to exemplary embodiments of the present general inventive concept.

FIG. 29 is an enlarged plane view illustrating the A area of the tape package 1 of FIG. 1, according to exemplary embodiments of the present general inventive concept. The semiconductor chip 20e illustrated in FIG. 29 corresponds to the semiconductor chip 20e described with reference to FIG. 28. The present general inventive concept may include cases where the exemplary embodiment illustrated in FIG. 29 is combined with the above-described embodiments.

Referring to FIG. 29, the output pads 230 and the input pads 410 may be disposed adjacent to the first edge 21 of the semiconductor chip 20e mounted on the tape wiring substrate 10. The output pads 230b and 230c may be disposed adjacent to the third edge 23, the fourth edge 24, or both the third and fourth edges 23 and 24. The output pads 230 disposed adjacent to the first edge 21 may include the first output pads 231 disposed adjacent to the first edge 21 and the second output pads 232 disposed to be farther spaced apart from the first edge 21 than the first output pads 231. The input pads 410 may include first input pads 411 disposed adjacent to the first edge 21 and the second input pads 412 disposed to be farther spaced apart from the first edge 21 than the first input pads 411. The output pads 230b disposed adjacent to the third edge 23 may include the fifth output pads 235 disposed adjacent to the third edge 23 and the sixth output pads 236 disposed to be farther spaced apart from the third edge 23 than the fifth output pads 235. The output pads 230c disposed adjacent to the fourth edge 24 may include the seventh output pads 237 disposed adjacent to the fourth edge 24 and the eighth output pads 238 disposed to be farther spaced apart from the fourth edge 24 than the seventh output pads 237.

The output wirings 130 disposed adjacent to the first edge 21 may include the first output wirings 131 and the second output wirings 132. The first output wirings 131 may extend toward portions of the first output pads 231 that are close to the first edge 21 to be respectively connected to the first output pads 231. The second output wirings 132 may extend toward portions of the second output pads 232 that are farther from the first edge 21 than the first output pads 231 to be respectively connected to the second output pads 232.

The input wirings 310 may include the first input wirings 311 and the second input wirings 312. The first input wirings 311 may extend toward portions of the first input pads 411 that are close to the first edge 21 to be respectively connected to the first input pads 411. The second input wirings 312 may extend toward portions of the second input pads 412 that are farther from the first edge 21 than the first input pads 411 to be respectively connected to the second input pads 412.

A plurality of output wirings 130b disposed adjacent to the third edge 23 may include fifth output wirings 135 and sixth output wirings 136. The fifth output wirings 135 may extend toward portions of the fifth output pads 235 that are close to the third edge 23 to be respectively connected to the fifth output pads 235. The sixth output wirings 136 may extend toward portions of the sixth output pads 236 that are farther from the third edge 23 than the fifth output pads 235 to be respectively connected to the sixth output pads 236.

A plurality of output wirings 130c disposed adjacent to the fourth edge 24 may include seventh output wirings 137 and eighth output wirings 138. The seventh output wirings 137 may extend toward portions of the seventh output pads 237 that are close to the fourth edge 24 to be respectively connected to the seventh output pads 235. The eighth output wirings 138 may extend toward portions of the eighth output pads 238 that are farther from the fourth edge 24 than the seventh output pads 237 to be respectively connected to the eighth output pads 238.

Figure 30:
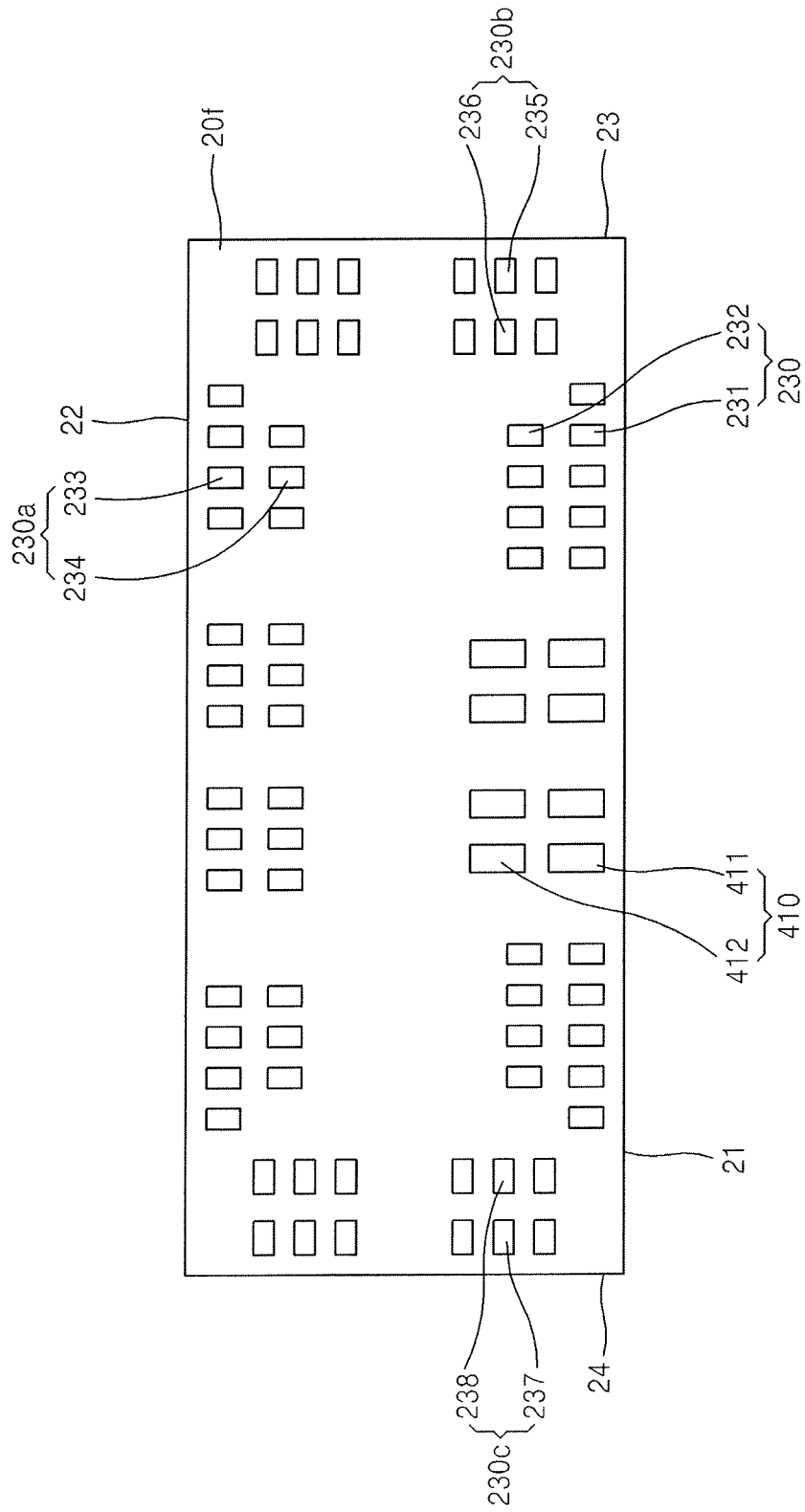
FIG. 30 is a rear view illustrating a semiconductor chip included in the tape package of FIG. 1, according to exemplary embodiments of the present general inventive concept.

FIG. 30 is a rear view illustrating a semiconductor chip 20f included in the tape package 1 of FIG. 1, according to exemplary embodiments of the present general inventive concept.

Referring to FIG. 30, the semiconductor chip 20f may include the input pads 410 and the output pads 230 on a rear surface thereof to be adjacent to the first edge 21. The semiconductor chip 20f may further include the output pads 230a disposed adjacent to the second edge 22, the output pads 230b disposed adjacent to the third edge 23, and the output pads 230c disposed adjacent to the fourth edge 24. The semiconductor chip 20f illustrated in FIG. 30 corresponds to a case where the exemplary embodiment illustrated in FIG. 26 and the exemplary embodiment illustrated in FIG. 28 are combined together.

Figure 31:
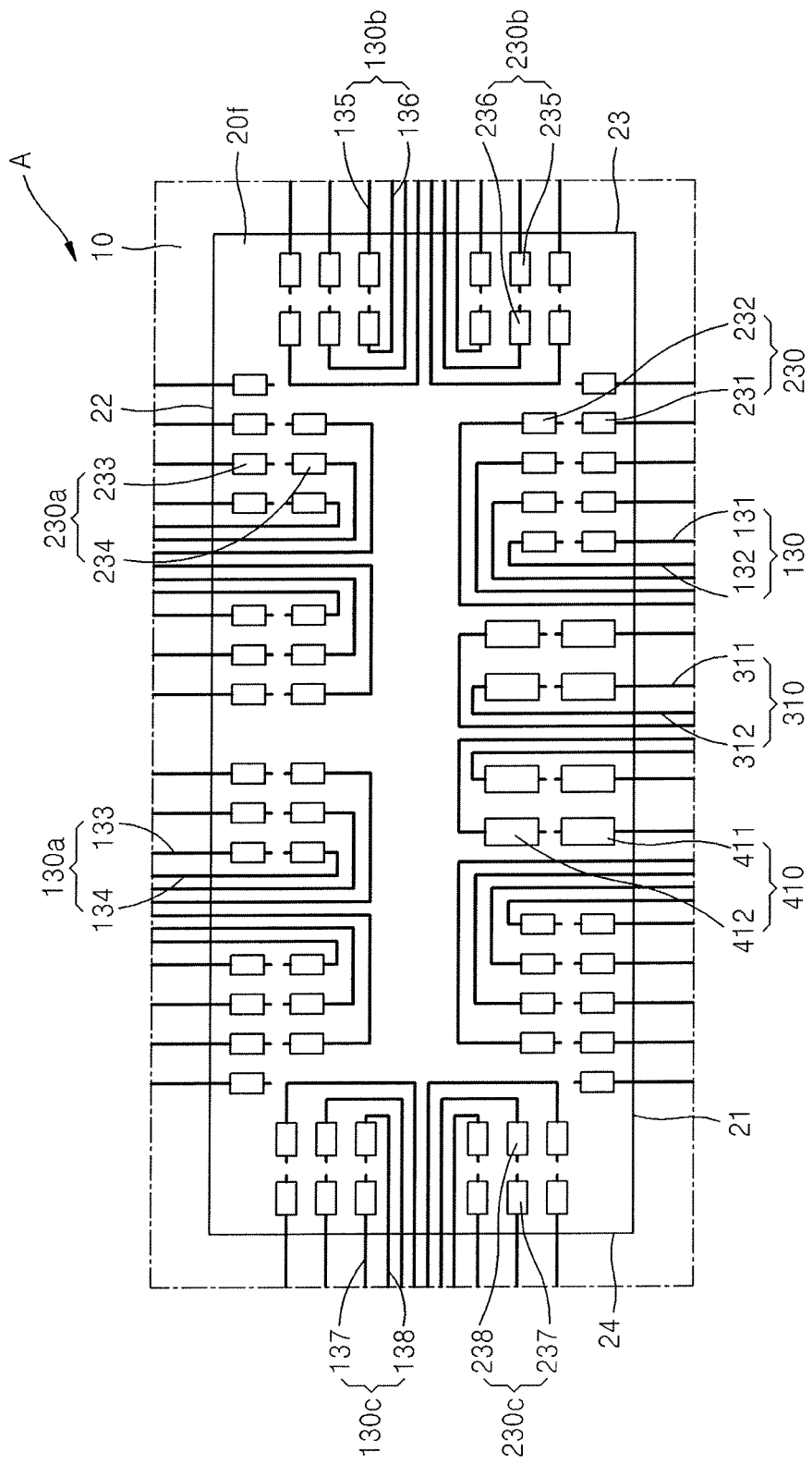
FIG. 31 is an enlarged plane view illustrating the A area of the tape package of FIG. 1, according to exemplary embodiments of the present general inventive concept.

FIG. 31 is an enlarged plane view illustrating the A area of the tape package 1 of FIG. 1, according to exemplary embodiments of the present general inventive concept. The semiconductor chip 20f illustrated in FIG. 31 corresponds to the semiconductor chip 20f described with reference to FIG. 30. The present general inventive concept may include cases where the exemplary embodiment illustrated in FIG. 31 is combined with the above-described embodiments.

Referring to FIG. 31, pads are arranged in a plurality of rows to be adjacent to all edges of the semiconductor chip 20f mounted on the tape wiring substrate 10. That is, the output pads 230 and the input pads 410 may be disposed adjacent to the first edge 21, the output pads 230a may be disposed adjacent to the second edge 22 facing the first edge 21 of the semiconductor chip 20f, and the output pads 230b and 230c may be disposed adjacent to the third or fourth edge 23 or 24 perpendicular to the first edge 21 or to both the third and fourth edges 23 and 24. The input wirings 310 and the output wirings 130, 130a, 130b, and 130c respectively connected to the input pads 410 and the output pads 230, 230a, 230b, and 230c have been described above with reference to FIGS. 25, 27, and 29.

Figure 32:
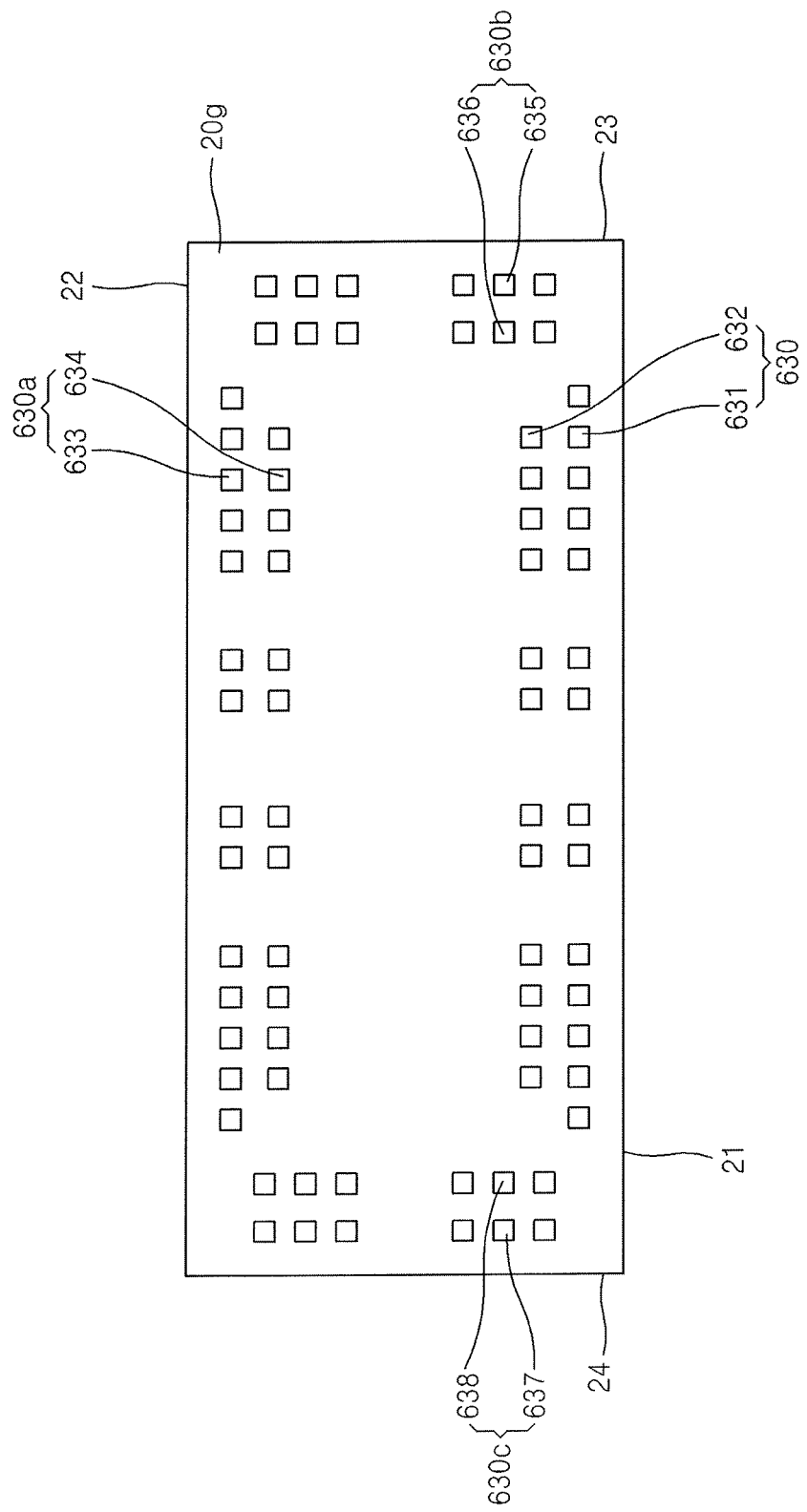
FIG. 32 a rear view illustrating a semiconductor chip included in the tape package of FIG. 1, according to exemplary embodiments of the present general inventive concept.

FIG. 32 a rear view illustrating a semiconductor chip 20g included in the tape package 1 of FIG. 1, according to some embodiments of the inventive concept.

Referring to FIG. 32, the semiconductor chip 20g may include pads 630 disposed adjacent to the first edge 21, pads 630a disposed adjacent to the second edge 22, pads 630b disposed adjacent to the third edge 23, and pads 630c disposed adjacent to the fourth edge 24 on a rear surface thereof. The pads 630, 630a, 630b, and 630c may perform input and output functions. The pads 630, 630a, 630b, and 630c may, for example, be formed on a rear surface of a memory semiconductor chip. Also, the pads 630, 630a, 630b, and 630c may have the same shape, for example, a square shape. In addition, the semiconductor chip 20g may be a memory semiconductor chip.

The pads 630, 630a, 630b, and 630c each includes pads arranged in a plurality of rows. The pads may correspond to a case where the exemplary embodiment illustrated in FIG. 2 and the exemplary embodiment illustrated in FIG. 17 are combined together and a case where the exemplary embodiment illustrated in FIG. 26 and the exemplary embodiment illustrated in FIG. 28 are combined together. That is, pads 630 may include first output pads 631 and second output pads 632. Pads 630a may include third output pads 633 and fourth output pads 634. Pads 630b can include fifth output pads 635 and sixth output pads 636. Pads 630c may include seventh output pads 637 and eighth output pads 638. The first output pads 631, second output pads 632, third output pads 633, fourth output pads 634, fifth output pads 635, sixth output pads 636, seventh output pads 637, and eighth output pads 638 illustrated in FIG. 32 are similar to the first, second, third, fourth, fifth, sixth, seventh, and eighth output pads discussed in detail above in connection with the exemplary embodiments of the present general inventive concept.

Figure 33:
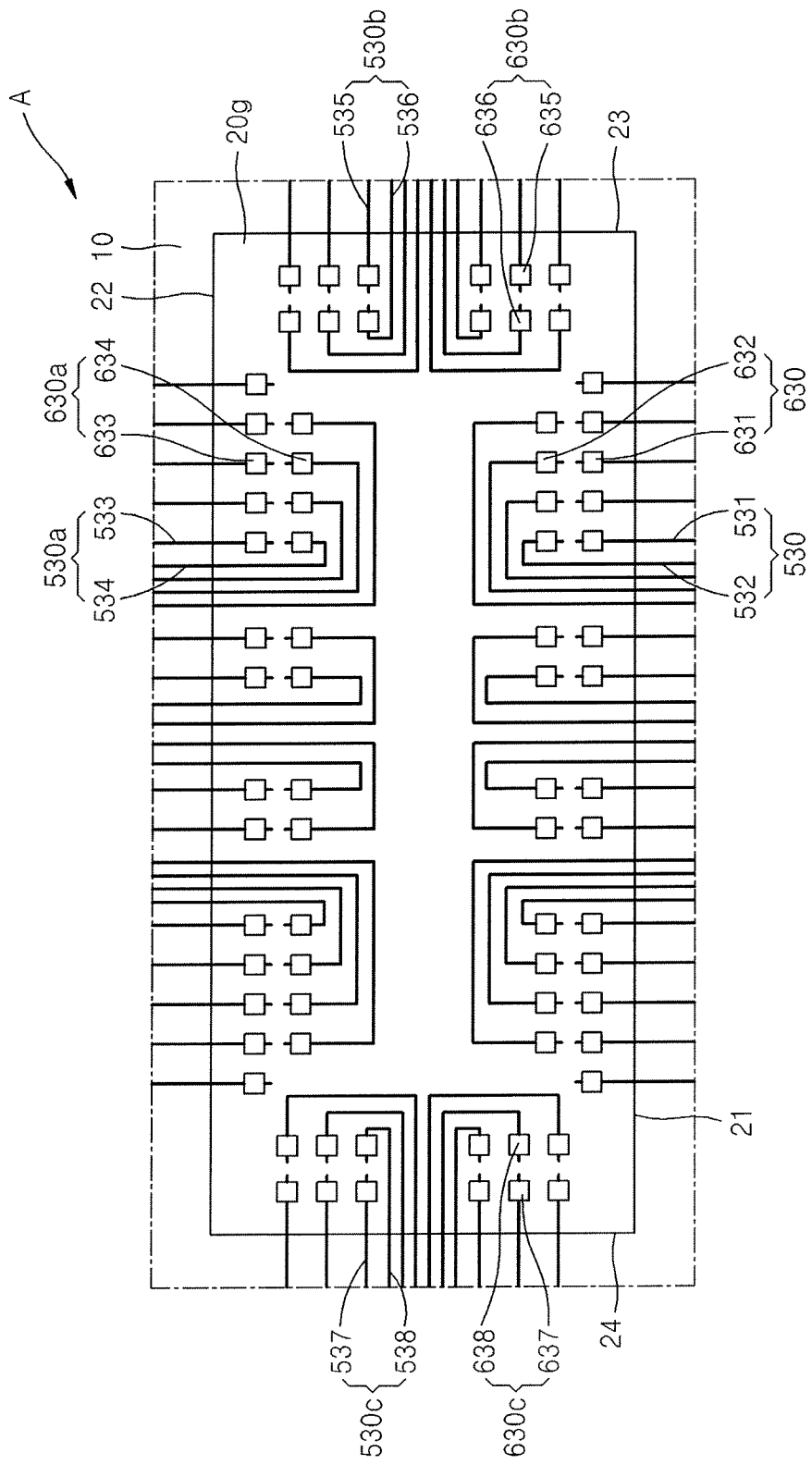
FIG. 33 is an enlarged plane view illustrating the A area of the tape package of FIG. 1, according to exemplary embodiments of the present general inventive concept.

FIG. 33 is an enlarged plane view illustrating the A area of the tape package 1 of FIG. 1, according to exemplary embodiments of the present general inventive concept. The semiconductor chip 20g illustrated in FIG. 33 corresponds to the semiconductor chip 20g described with reference to FIG. 32. The inventive concept may include cases where the exemplary embodiment illustrated in FIG. 33 is combined with the above-described embodiments.

Referring to FIG. 33, pads are arranged in a plurality of rows to be adjacent to all edges of the semiconductor chip 20f mounted on the tape wiring substrate 10. The pads 630 may be disposed adjacent to the first edge 21, the pads 630a may be disposed adjacent to the second edge 22 facing the first edge 21 of the semiconductor chip 20g, and the pads 630b and 630c may be disposed adjacent to the third or fourth edge 23 or 24 perpendicular to the first edge 21 or to both the third and fourth edges 23 and 24. Pads 630 may include first output pads 631 and second output pads 632. Pads 630a may include third output pads 633 and fourth output pads 634. Pads 630b can include fifth output pads 635 and sixth output pads 636. Pads 630c may include seventh output pads 637 and eighth output pads 638. The first output pads 631, second output pads 632, third output pads 633, fourth output pads 634, fifth output pads 635, sixth output pads 636, seventh output pads 637, and eighth output pads 638 illustrated in FIG. 33 are similar to the first, second, third, fourth, fifth, sixth, seventh, and eighth output pads discussed in detail above in connection with the exemplary embodiments of the present general inventive concept.

A plurality of wirings 530, 530a, 530b, and 530c respectively connected to the pads 630, 630a, 630b, and 630c have been described with reference to FIGS. 25, 27, and 29. That is, the wirings 530 disposed adjacent to the first edge 21 may include a plurality of first wirings 531 and a plurality of second wirings 532 that correspond to the first output wirings 131 and the second output wirings 132 described above. The wirings 530a disposed adjacent to the second edge 22 may include a plurality of third wirings 533 and a plurality of fourth wirings 534 that correspond to the third output wirings 133 and the fourth output wirings 134 described above. The wirings 530b disposed adjacent to the third edge 23 may include a plurality of fifth wirings 535 and a plurality of sixth wirings 536 that correspond to the fifth output wirings 135 and the sixth output wirings 136 described above. The wirings 530c disposed adjacent to the fourth edge 24 may include a plurality of seventh wirings 537 and a plurality of eighth wirings 538 that correspond to the seventh output wirings 137 and the eighth output wirings 138 described above.

FIG. 34 illustrates graphs illustrating a thermal stress effect according to arrangement of pads of a semiconductor chip included in a tape package (e.g., semiconductor chip 20 included in tape package 1), according to exemplary embodiments of the present general inventive concept. The graphs illustrate thermal stress distributions along an edge of a semiconductor chip due to heat transferred to the pads when the semiconductor chip operates.

In FIG. 34, Case A illustrates when the pads are uniformly arranged along the edge of the semiconductor chip (e.g., semiconductor chip 20). In this case, thermal stress is higher in an outer portion of the semiconductor chip (e.g., the portion adjacent to the third edge 23 and the fourth edge 24 of the semiconductor chip 20) than in a central portion. The thermal stress is low in an outermost portion due to heat transfer. Since heat spreads from the central portion to the outer portion, reliability of the semiconductor chip may be stably maintained.

Case B illustrates when the pads are arranged in a plurality of rows in the central portion of the semiconductor chip. In this case, thermal stress is high in the central portion of the semiconductor chip, which may degrade reliability of the semiconductor chip.

Case C illustrates when the pads are arranged in a plurality of rows in the outer portion of the semiconductor chip (e.g., the portion adjacent to the third edge 23 and the fourth edge 24 of the semiconductor chip 20). In this case, thermal stress in the outer portion of the semiconductor chip is similar to that in the central portion of the semiconductor chip. The case where the pads are arranged in a plurality of rows illustrates increased thermal stress, compared to a case where the pads are arranged in a row as illustrated in a dotted line. However, in Case C, heat spreads from the central portion to the outer portion, and thus reliability of the semiconductor chip may be stably maintained. For example, the exemplary embodiment illustrated in FIG. 3 may have such an effect.

Figure 35:
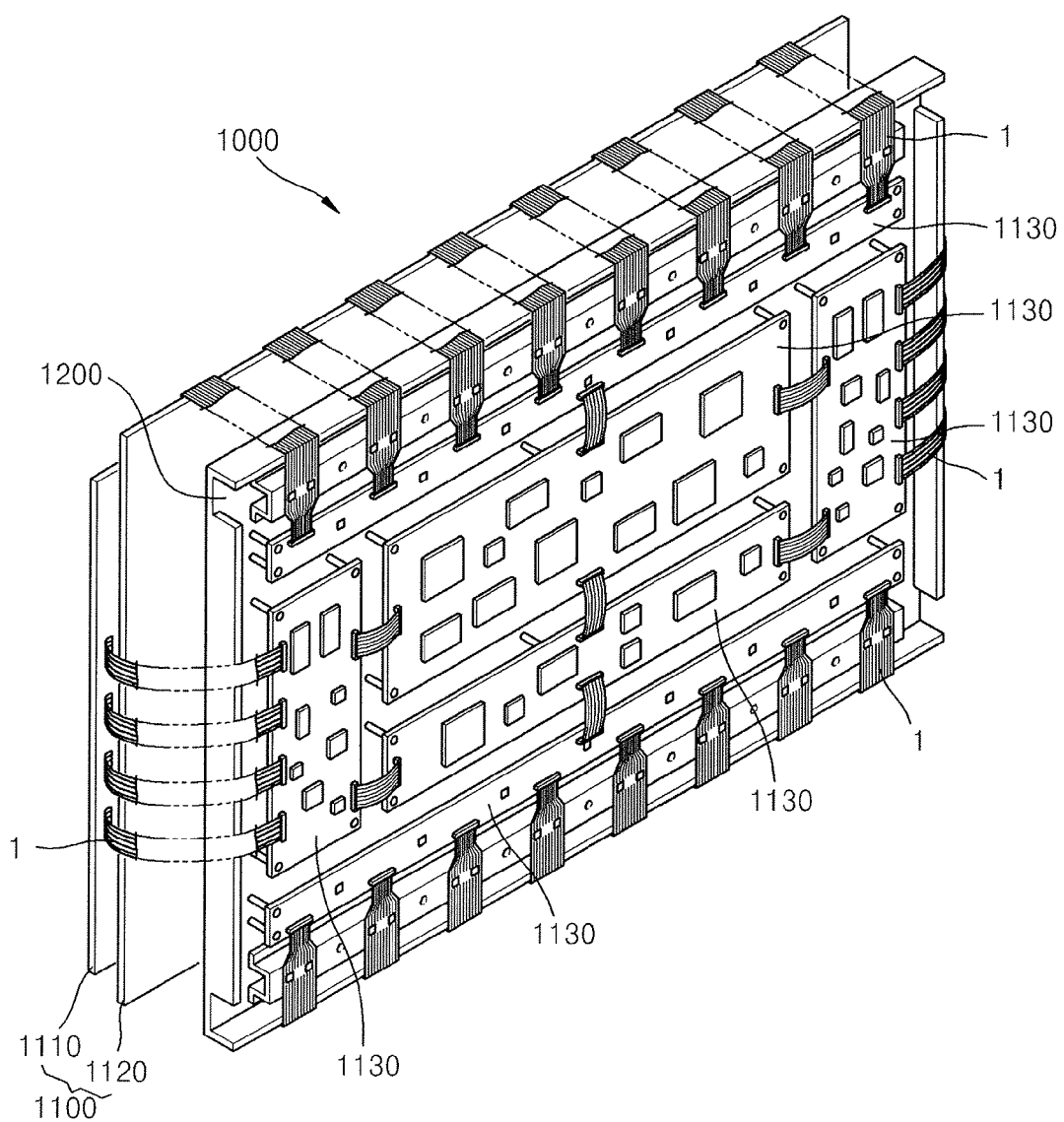
FIG. 35 is a perspective view illustrating a display device including a tape package, according to exemplary embodiments of the present general inventive concept.

FIG. 35 is a perspective view illustrating a display device 1000 including a tape package 1, according to exemplary embodiments of the present general inventive concept.

Referring to FIG. 35, the display device 1000 may be a thin firm transistor-liquid crystal display (TFT-LCD), a plasma display panel (PDP), an organic light emitting diode (OLED), or a field emission display (FED). The display device 1000 may be the TFT-LCD.

The display device 1000 may display an image and include a display panel 1100 including a front panel 1110 and a rear panel 1120. The display panel 1100 may include a plurality of gate lines (not illustrated), a plurality of data lines (not illustrated), and a plurality of pixels (not illustrated). The pixels may be respectively formed in cross-points between the gate lines and the data lines. The pixels each may include a thin film transistor (TFT) (not illustrated) including a gate electrode connected to a gate line and a source electrode connected to a data line.

A chassis base 1200 is disposed at a rear side of the display panel 1100. A plurality of printed circuit boards 1130 are attached to the chassis base 1200. The tape package 1 according to the exemplary embodiments of the present general inventive concept may be electrically connected to the printed circuit boards 1130. The input wirings 110 of the tape package 1 may be electrically connected to the printed circuit boards 1130. The output wirings 130 of the tape package 1 may be electrically connected to the display panel 1100.

The semiconductor chip 20 mounted on the tape package 1 may include driving circuits for driving the display panel 1100. For example, the semiconductor chip 20 may include a gate driver for driving a gate line and a data driver for driving a data line.

The printed circuit board 1130 may include a timing controller (not illustrated) and a power supplying unit (not illustrated). The timing controller may control driving timings of the gate driver and the data driver. The power supplying unit may supply power to the display panel 1100 and the driving circuits of the semiconductor chip 20 mounted on the tape package 1.

Figure 36:
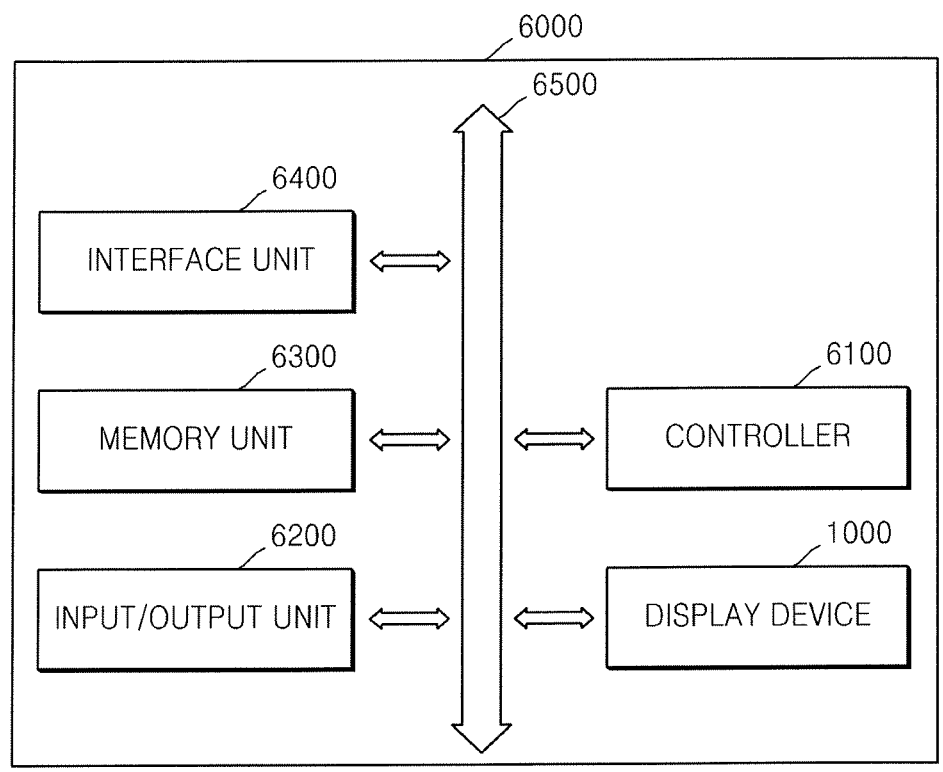
FIG. 36 is a schematic block diagram illustrating a system including a tape package, according to exemplary embodiments of the present general inventive concept.

FIG. 36 is a schematic block diagram illustrating a system including a tape package (e.g., the tape package 1), according to exemplary embodiments of the present general inventive concept.

FIG. 36 is a schematic diagram of a system 6000 including a tape package 1 according to exemplary embodiments of the present general inventive concept.

Referring to FIG. 36, the system 6000 may include a controller 6100, an input/output device 6200, a memory 6300, an interface 6400, and the display device 1000 having the tape package 1 as illustrated in FIG. 35 and discussed above. The system 6000 may be a mobile system or a system that transmits or receives data. The mobile system may be a personal digital assistant (PDA), a portable computer, a web tablet, a wireless phone, a mobile phone, a digital music player, or a memory card. The controller 6100 executes a software program and controls the system 6000. The controller 6100 may be a microprocessor, a digital signal processor, a microcontroller, or the like. The input/output device 6200 can be used to input or output data of the system 6000. The system 6000 is connected to an external apparatus, for example, a personal computer or a network, using the input/output device 6200, to send/receive data to/from the external apparatus. The input/output device 6200 may be a keypad, a keyboard, or a display. The system 6000 can include the display device 1000 having the tape package 1 to display output to a user. The memory 6300 may store codes and/or data for operating the controller 6100 and/or may store data processed by the controller 6100. The memory 6300 may include a tape package according to exemplary embodiments of the present general inventive concept. The interface 6400 may be a data transmission path between the system 6000 and an external apparatus. The controller 6100, the input/output device 6200, the memory 6300, and the interface 6400 may communicate with one another by a bus 6500. For example, the system 6000 can be used for a mobile phone, a MP3 player, a navigation system, a portable multimedia player (PMP), a solid state disk (SSD), or a household appliance. At least one of the controller 6100, the input/output unit 6200, the memory unit 6300, the interface unit 6400, and the bus 6500 of the system 6000 may be included on the tape package 1 illustrated in at least FIG. 1 and described above.

The foregoing is illustrative of exemplary embodiments and is not to be construed as limiting thereof. Although exemplary embodiments have been illustrated and described, those of ordinary skill in the art will readily appreciate that many modifications are possible in the exemplary embodiments without materially departing from the novel teachings, utilities and advantages of the exemplary embodiments. Accordingly, all such modifications are intended to be included within the scope of the claims. Exemplary embodiments are defined by the following claims, with equivalents of the claims to be included therein.

What is claimed is:

1. A tape package comprising:
   a tape wiring substrate including first and second wirings; and
   a semiconductor chip mounted on the tape wiring substrate including a first edge, a first pad disposed adjacent to the first edge, and a second pad disposed to be farther spaced apart from the first edge than the first pad,
   wherein the first wiring is connected to a portion of the first pad that is spaced from the first edge by a first distance,
   wherein the second wiring is connected to a portion of the second pad that is spaced from the first edge by a second distance that is greater than the first distance, and
   wherein the second wiring comprises:
      a first portion extending in a first direction;
      a second portion connected to the first portion and extending from the first portion in a second direction having a first angle to the first direction; and
      a third portion connected to the second portion, extending from the second portion in a third direction having a second angle to the second direction, and connected to a portion of the second pad relatively far from the first edge, the third portion being parallel to the first portion and the third direction being different from the first direction.

2. The tape package of claim 1, wherein the first wiring and the second wiring are respectively connected to the first pad and the second pad in opposite directions.

3. The tape package of claim 1, wherein the first wiring and the second wiring extend parallel to each other.

4. The tape package of claim 1, wherein the second wiring comprises one or more bending portions.

5. The tape package of claim 4, wherein at least some of the bending portions are perpendicular types or curved types.

6. The tape package of claim 1, wherein the second portion is connected to end areas of the first portion and the third portion.

7. The tape package of claim 1, wherein the second portion is connected to the first portion and the third portion so as to cross them.

8. The tape package of claim 1, wherein the second wiring comprises:
   the second portion connected to a portion of the second pad that is spaced from the first edge by the second distance.

9. The tape package of claim 1, wherein the second pad is arranged with respect to the first pad in a vertical direction with respect to the first edge.

10. A tape package comprising:
    a tape wiring substrate including one or more first wirings and one or more second wirings; and
    a semiconductor chip mounted on the tape wiring substrate, and comprising a first edge, one or more first pads arranged in a first row to be disposed adjacent to and spaced from the first edge by a first distance, and one or more second pads arranged in a second row to be spaced apart from the first edge by a second distance that is greater than the first distance,
    wherein each of the first wirings is connected to a portion of each of the first pads spaced by the first distance from the first edge,
    wherein each of the second wirings is connected to a portion of each of the second pads spaced by the second distance from the first edge, and
    wherein the second wiring comprises:
       a first portion extending in a first direction;
       a second portion connected to the first portion and extending from the first portion in a second direction having a first angle to the first direction; and
       a third portion connected to the second portion, extending from the second portion in a third direction having a second angle to the second direction, and connected to a portion of the second pad relatively far from the first edge, the third portion being parallel to the first portion and the third direction being different from the first direction.

11. The tape package of claim 10, wherein a plurality of the second pads are adjacent to one another.

12. The tape package of claim 10, wherein a plurality of the second wirings are adjacent to one another.

13. The tape package of claim 10, wherein a plurality of the second wirings extend in the same direction to be connected to the second pads, respectively.

14. The tape package of claim 10, wherein a plurality of the second wirings extend in opposite directions to be connected to the second pads, respectively.

15. The tape package of claim 10, wherein each of the second pads is disposed adjacent to each of the second wirings connected thereto.

16. A tape package comprising:
a tape wiring substrate including one or more input wirings, one or more first output wirings, and one or more second output wirings; and
a semiconductor chip mounted on the tape wiring substrate including a first edge, input pads respectively connected to the input wirings, one or more first output pads arranged in a first row to be disposed adjacent to the first edge, and one or more second output pads arranged in a second row to be farther spaced from the first edge than the first output pads,
wherein each of the first output wirings is connected to a portion of each of the first output pads that are spaced at a first distance from the first edge,
wherein each of the second output wirings is connected to a portion of each of the second output pads that are spaced at a second distance from the first edge that is greater than the first distance, and
wherein the second wiring comprises:
a first portion extending in a first direction;
a second portion connected to the first portion and extending from the first portion in a second direction having a first angle to the first direction; and
a third portion connected to the second portion, extending from the second portion in a third direction having a second angle to the second direction, and connected to a portion of the second pad relatively far from the first edge, the third portion being parallel to the first portion and the third direction being different from the first direction.

17. The tape package of claim 16, wherein the input pads comprise one or more first input pads arranged in a third row to be disposed adjacent to the first edge and one or more second input pads arranged in a fourth row to be farther spaced from the first edge than the first input pads.

18. The tape package of claim 17, wherein the input wirings comprise first input wirings and second input wirings, each of the first input wirings is connected to a portion of each of the first input pads that are spaced from the first edge, and each of the second input wirings is connected to a portion of each of the second input pads that are spaced further from the first edge than the first input pads.

19. The tape package of claim 17, wherein each of the first input wirings is connected to a portion of each of the first input pads that are spaced close to the first edge, and each of the second input wirings is connected to a portion of each of the second input pads that are spaced close to the first edge.

20. A tape package comprising:
a tape wiring substrate including first and second wirings;
a semiconductor chip mounted on the tape wiring substrate, the semiconductor chip having a first edge;
a first pad disposed on the semiconductor chip so as to be centered on a first axis and spaced from the first edge by a first distance, the first pad coupled to the first wiring; and
a second pad disposed on the semiconductor chip so as to be centered on the first axis and to be spaced from the first edge by a second distance that is greater than the first distance, the second pad coupled to the second wiring,
wherein the second wiring comprises:
a first portion extending in a first direction;
a second portion connected to the first portion and extending from the first portion in a second direction having a first angle to the first direction; and
a third portion connected to the second portion, extending from the second portion in a third direction having a second angle to the second direction, and connected to a portion of the second pad relatively far from the first edge, the third portion being parallel to the first portion and the third direction being different from the first direction.

21. The tape package of claim 20, further comprising:
at least one input pad disposed adjacent to the first pad,
wherein the tape wiring substrate includes input wiring that is coupled to the at least one input pad.

22. The tape package of claim 20, further comprising:
at least one input pad disposed adjacent to the second wirings.

23. The tape package of claim 20, further comprising:
a first input pad disposed on the semiconductor chip so as to be centered on a third axis and spaced from the first edge by a third distance, the first input pad coupled to a first input wiring included in the tape wiring substrate; and
a second input pad disposed on the semiconductor chip so as to be centered on the third axis and to be spaced from the first edge by a fourth distance that is greater than the third distance, the second input pad coupled to a second input wiring included in the tape wiring substrate.

24. The tape package of claim 23, wherein the second input wiring is disposed adjacent to the first input pad and the second input pad.

25. The tape package of claim 23, wherein the second input wiring is adjacent to at least one of the first pad and the second pad.

26. The tape package of claim 23, wherein the second input pad is spaced from the first edge by the fourth distance so as to be adjacent to a second edge of the semiconductor chip.

27. A tape package comprising:
a tape wiring substrate including first and second wirings;
a semiconductor chip mounted on the tape wiring substrate, the semiconductor chip having a first edge;
a plurality of first pads disposed on the semiconductor chip so as to be respectively centered on a plurality of axes that are parallel to one another, the plurality of first pads being spaced from the first edge by a first distance, and each of the plurality of first pads coupled to the first wirings; and
a plurality of second pads disposed on the semiconductor chip so as to be respectively centered on the plurality of axes and to be spaced from the first edge by a second distance that is greater than the first distance, and each of the plurality of second pads coupled to the second wirings,
wherein the second wiring comprises:
   a first portion extending in a first direction;
   a second portion connected to the first portion and extending from the first portion in a second direction having a first angle to the first direction; and
a third portion connected to the second portion, extending from the second portion in a third direction having a second angle to the second direction, and connected to a portion of the second pad relatively far from the first edge, the third portion being parallel to the first portion and the third direction being different from the first direction.

28. The tape package of claim 27, further comprising:
at least one input pad disposed adjacent to at least one of the plurality of first pads,
wherein the tape wiring substrate includes input wiring that is coupled to the at least one input pad.

29. The tape package of claim 27, further comprising:
at least one input pad disposed adjacent to the second wirings.

30. The tape package of claim 27, further comprising:
a first input pad disposed on the semiconductor chip so as to be centered on a third axis and spaced from the first edge by a third distance, the first input pad coupled to a first input wiring included in the tape wiring substrate; and
a second input pad disposed on the semiconductor chip so as to be centered on the third axis and to be spaced from the first edge by a fourth distance that is greater than the third distance, the second input pad coupled to a second input wiring included in the tape wiring substrate.

31. The tape package of claim 30, wherein the second input wiring is disposed adjacent to the first input pad and the second input pad.

32. The tape package of claim 30, wherein the second input wiring is adjacent to at least one of the plurality of first pads and at least one of the plurality of second pads.

33. The tape package of claim 30, wherein the second input pad is spaced from the first edge by the fourth distance so as to be adjacent to a second edge of the semiconductor chip.

* * * * *